United States Patent
Chen et al.

(10) Patent No.: US 9,513,502 B2
(45) Date of Patent: Dec. 6, 2016

(54) FLEXIBLE DISPLAY

(71) Applicant: AU Optronics Corp., Hsin-Chu (TW)

(72) Inventors: Ji-Feng Chen, Hsin-Chu (TW);
Chia-Hsun Tu, Hsin-Chu (TW);
Po-Yang Lin, Hsin-Chu (TW);
Chen-Shuo Huang, Hsin-Chu (TW);
Keh-Long Hwu, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 41 days.

(21) Appl. No.: 14/501,067

(22) Filed: Sep. 30, 2014

(65) Prior Publication Data

US 2015/0091016 A1 Apr. 2, 2015

(30) Foreign Application Priority Data

Sep. 30, 2013 (TW) .............................. 102135368 A
Aug. 28, 2014 (TW) .............................. 103129727 A

(51) Int. Cl.
| | | |
|---|---|---|
| *G06F 3/033* | (2013.01) | |
| *G02F 1/1333* | (2006.01) | |
| *G02F 1/133* | (2006.01) | |
| *G02F 1/1362* | (2006.01) | |
| *G09G 3/32* | (2016.01) | |
| *H01L 27/32* | (2006.01) | |

(52) U.S. Cl.
CPC ......... *G02F 1/13338* (2013.01); *G02F 1/1362* (2013.01); *G02F 1/13318* (2013.01); *G02F 1/133305* (2013.01); *G09G 3/3225* (2013.01); *H01L 27/326* (2013.01); *H01L 27/3244* (2013.01); *G09G 2300/043* (2013.01); *G09G 2300/0426* (2013.01); *G09G 2300/08* (2013.01); *G09G 2340/04* (2013.01); *G09G 2380/02* (2013.01); *H01L 2251/5338* (2013.01)

(58) Field of Classification Search
CPC .................. G06F 1/1652; G06F 2203/04102; G09G 2380/02
See application file for complete search history.

(56) References Cited

U.S. PATENT DOCUMENTS

| | | | |
|---|---|---|---|
| 7,127,949 | B2 | 10/2006 | Akkipeddi |
| 8,542,211 | B2 | 9/2013 | Elias |
| 2003/0227441 | A1* | 12/2003 | Hioki ................. G06F 3/0412 345/156 |
| 2008/0315568 | A1 | 12/2008 | Bergvall |
| 2012/0092363 | A1 | 4/2012 | Kim |
| 2014/0125578 | A1 | 5/2014 | Zhou |

FOREIGN PATENT DOCUMENTS

| | | |
|---|---|---|
| CN | 102629446 A | 8/2012 |
| CN | 103092407 A | 5/2013 |
| CN | 103594025 | 2/2014 |

* cited by examiner

*Primary Examiner* — Carolyn R Edwards
*Assistant Examiner* — Alecia D English
(74) *Attorney, Agent, or Firm* — WPAT, PC; Justin King

(57) ABSTRACT

A flexible display has a display layer, a thin-film transistor (TFT) layer and a flexible substrate. The display layer has a plurality of display units. The TFT layer has a plurality of pixel control circuits and a plurality of sensing circuits. The pixel control circuits are configured to control operations of the plurality of display units. Each of the sensing circuits is configured to generate a deformation signal according to deformation of the flexible display. The flexible substrate and the TFT layer are stacked.

18 Claims, 24 Drawing Sheets

FLEXIBLE DISPLAY

CROSS-REFERENCE TO RELATED APPLICATIONS

The disclosures of Taiwan Patent Application No. 102135368 filed on Sep. 30, 2013 and Taiwan Patent Application No. 103129727 filed on Aug. 28, 2014 including the specifications, drawings and abstracts are incorporated herein by reference in its entirety.

BACKGROUND OF THE INVENTION

1. Field of the Invention

The present invention is related to a flexible display, and more particularly, to a flexible display capable of sensing at least a curvature thereof.

2. Description of the Prior Art

Reading words or pictures printed on paper is the most familiar reading method for human beings. As paper printing techniques have advanced and printing costs have lowered, paper has been extensively used as a data storage medium for hundreds of years. However, as display techniques advance, it is possible that in the near future, paper may be replaced by flexible display. Like paper, flexible display is thin in profile, small in size, lightweight, easy to carry, and flexible. Therefore, it is expected that the flexible display can be applied in electronic paper or electronic books, replacing conventional paper and books as a popular data storage medium.

However, the technology of the flexible display in the prior art lacks a method for accurately calculating the curvature of the flexible display, such that the application of the flexible display is limited. For example, when the flexible display is twisted, the image displayed thereon becomes deformed accordingly. Since the curvature of the flexible display could not be calculated accurately, the image displayed on the twisted flexible display could not be adjusted accurately.

SUMMARY OF THE INVENTION

The embodiments of present invention provide a flexible display capable of calculating the curvature thereof by sensing variations of resistance of sensing units of the flexible display.

According to an embodiment of the present invention, a flexible display is provided. The flexible display has a display layer, a thin-film transistor (TFT) layer and a flexible substrate. The display layer has a plurality of display units. The TFT layer has a plurality of pixel control circuits and a plurality of sensing circuits. The pixel control circuits are configured to control operations of the plurality of display units. Each of the sensing circuits is configured to generate a deformation signal according to deformation of the flexible display. The flexible substrate and the TFT layer are stacked.

According to the embodiments of the present invention, each of the sensing circuits of the flexible display provides the deformation signal according to deformation of the flexible display, such that the deformation of the flexible display may be determined according to the deformation signals of the sensing circuits, and that related operations, e.g. image calibration, feedback of user motion, etc., of the flexible display may be performed according to the deformation of the flexible display. Moreover, since the pixel control circuits and the sensing circuit may be formed in the TFT layer of the flexible display, the manufacture procedure of the flexible display may be simplified. Additionally, sensitivity of the sensing unit may be improved by connecting a plurality of strain sensing units in series and/or connecting a plurality of first transistors in parallel.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is an equivalent circuit diagram of a sensing resistor and a first resistor in FIG. 4 when a corresponding first transistor is turned on.

FIG. 7 is an equivalent circuit diagram of the sensing resistor, the first resistor, a second resistor and a third resistor in FIG. 4 when the corresponding first transistor is turned on.

DETAILED DESCRIPTION

Figure 1:
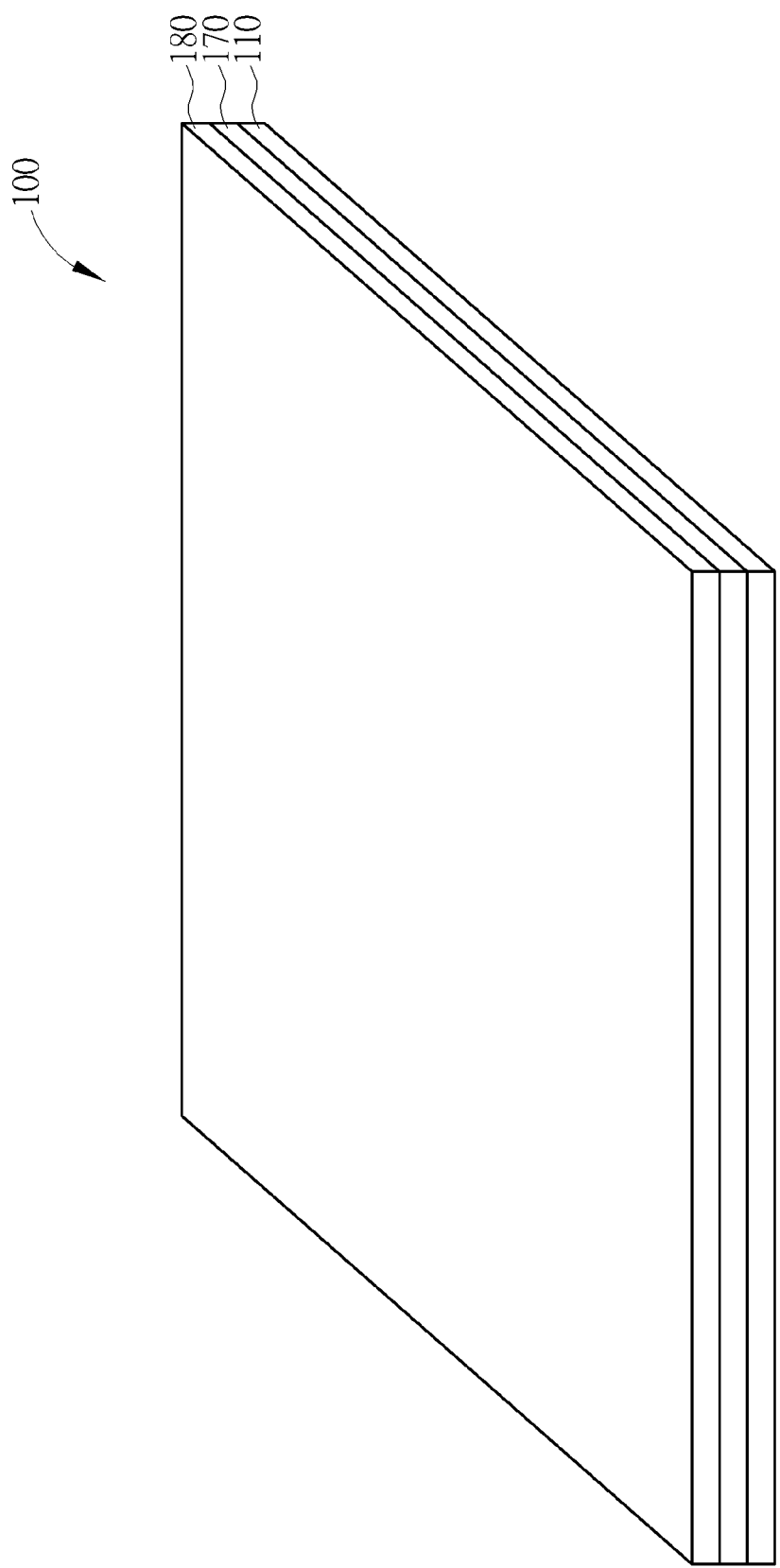
FIG. 1 is a schematic diagram of a flexible display according to an embodiment of the present invention.
Figure 2:
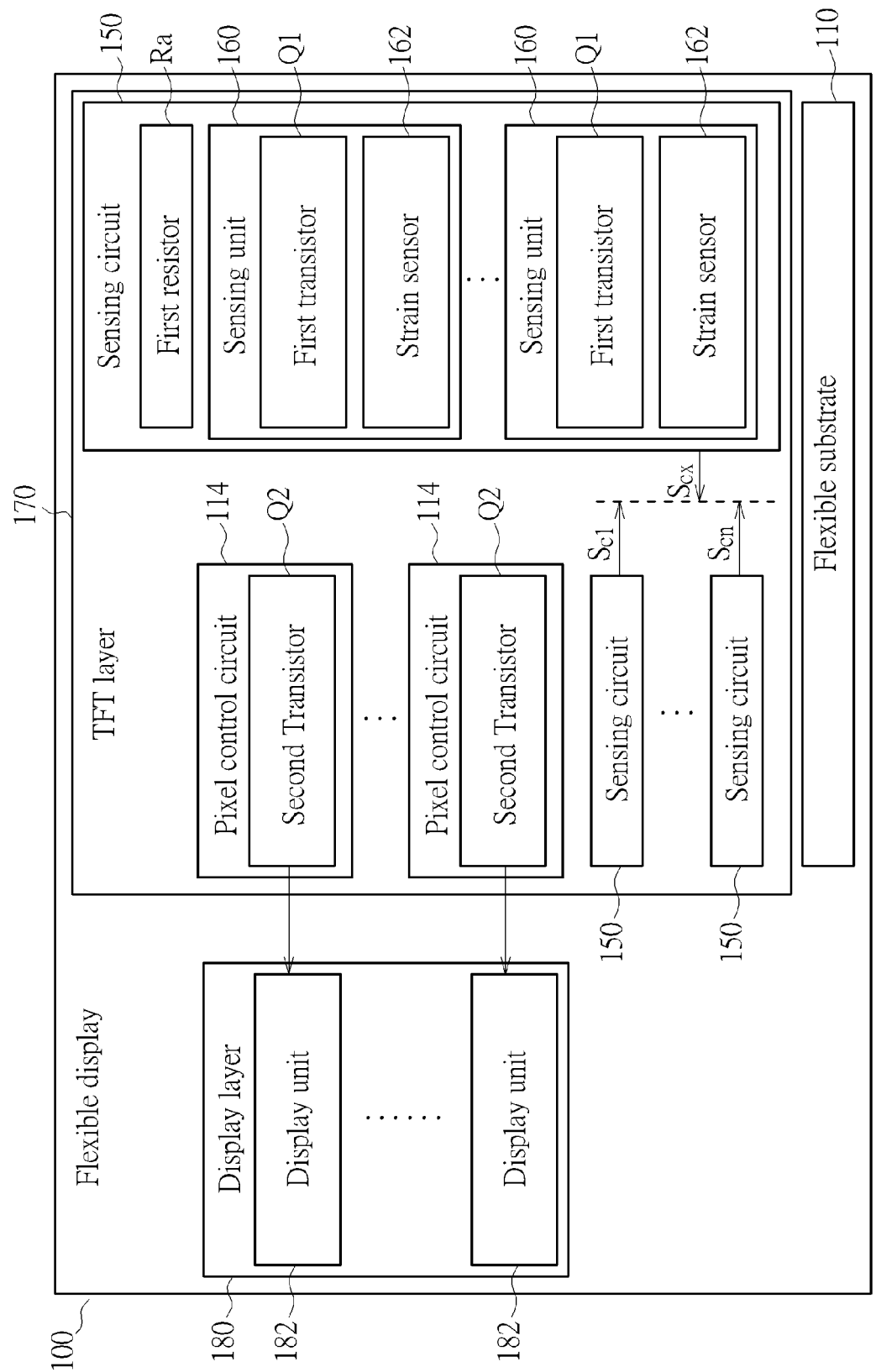
FIG. 2 is a functional block diagram of the flexible display in FIG. 1.

Please refer to FIG. 1 and FIG. 2. FIG. 1 is a schematic diagram of a flexible display 100 according to an embodiment of the present invention, and FIG. 2 is a functional block diagram of the flexible display 100 in FIG. 1. The flexible display 100 has a flexible substrate 110, a thin-film transistor (TFT) layer 170 and a display layer 180. The display layer 180 has a plurality of display units 182, and the display units 182 may be organic light emitting diodes (OLEDs) or liquid crystal. However, the present invention is not limited thereto. The TFT layer 170 has a plurality of pixel control circuits 114 and a plurality of sensing circuits 150. The pixel control circuits 114 are configured to control operations of the plurality of display units 182 of the display layer 180. Each of the sensing circuits 150 is configured to generate one of deformation signals $S_{c1}$ to $S_{cn}$ according to deformation of the flexible display 100. In the embodiment, the pixel control circuits 114 and the sensing circuits 150 are formed in the TFT layer 170. Therefore, the pixel control circuits 114 and the sensing circuits 150 may be simultaneously formed in the TFT layer 170 by performing the same manufacture procedure, such that the manufacture procedure of the flexible display 100 may be simplified. Moreover, the flexible substrate 110 and the TFT layer 170 are stacked. The flexible substrate 110 has a durable, sturdy, soft substrate (e.g. polyimide (PI), polycarbonate (PC), polyethersulfone (PES), polynorbornene (PNB), polyetherimide (PEI), poly (p-phenylene terephthalamide) or thinned glass, etc., which is flexible.

Figure 3:
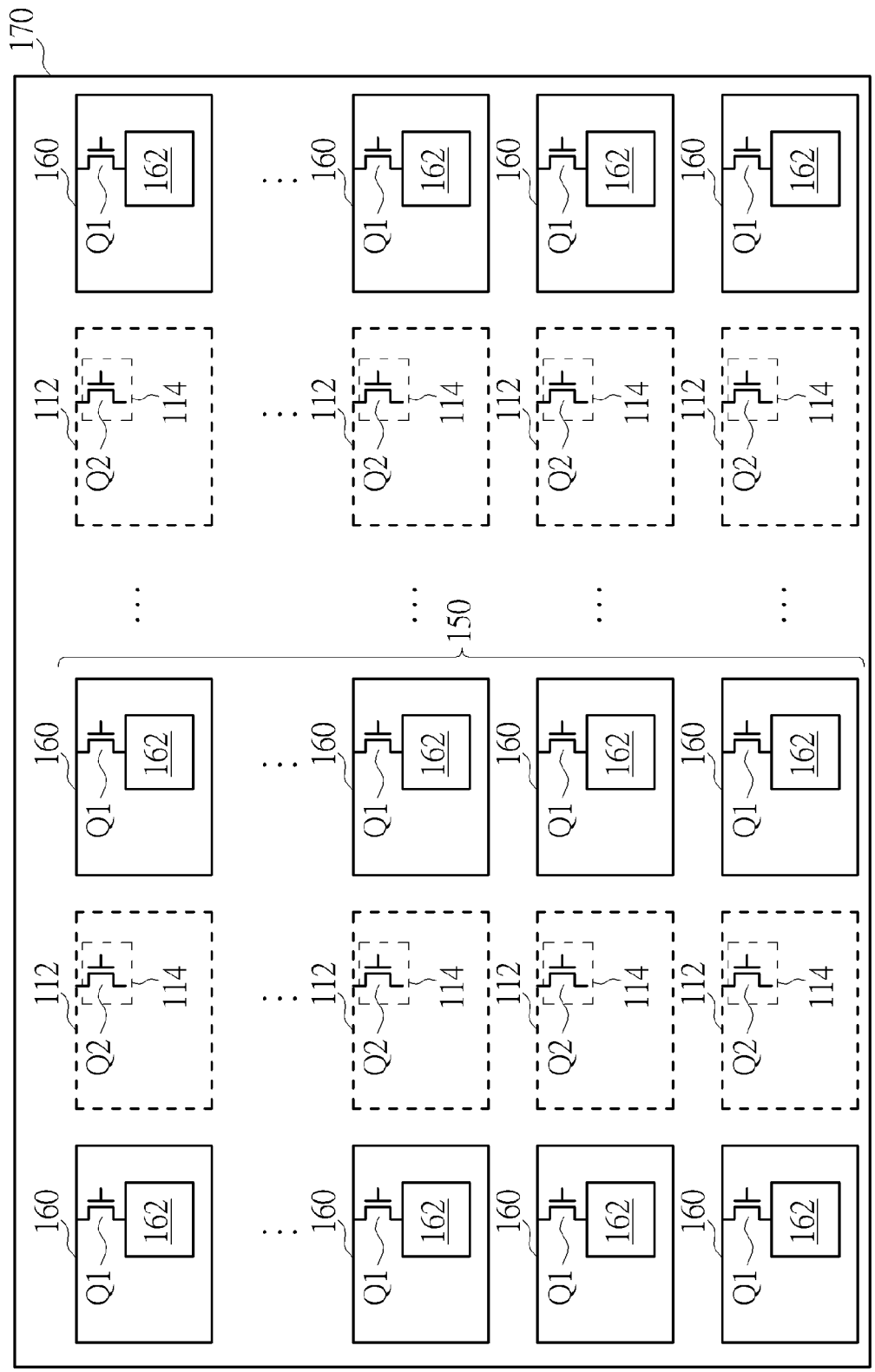
FIG. 3 is a schematic diagram of a thin-film transistor (TFT) layer of the flexible display in FIG. 1.

In an embodiment of the present invention, each of the pixel control circuits 114 and a corresponding display unit 182 may form a pixel. Please refer to FIG. 2 and FIG. 3. FIG. 3 is a schematic diagram of a thin-film transistor (TFT) layer 170 of the flexible display 100 in FIG. 1. In the embodiment, the flexible display 100 may be a monochrome display, and each of the pixel control circuits 114 in the TFT layer 170 and a corresponding display unit 182 in the display layer 180 may form a pixel 112. It is noted that because the pixel control circuits are formed in the TFT layer 170, and the display units may be formed in the display layer 180, the pixels 112 in FIG. 3 are presented by dotted lines rather than solid lines. The pixels 112 are arranged in a matrix, stacked with the flexible substrate 110, and configured to display images. The pixel control circuit 114 of each pixel 112 is configured to control operations of refreshing the pixel data of the pixel 112. In an embodiment of the present invention, the flexible display 100 may be a colorful display, and each pixel 112 may comprises a plurality of display units 182 and a plurality of pixel control circuits 114. For example, each pixel 112 may comprise three display units 182 and three pixel control circuits 114. The three display units 182 are used to display red, green and blue respectively, and each pixel control circuit 114 is coupled to a corresponding display unit 182 to refresh the display status (e.g. gray-level) of the corresponding display unit 182.

Figure 4:
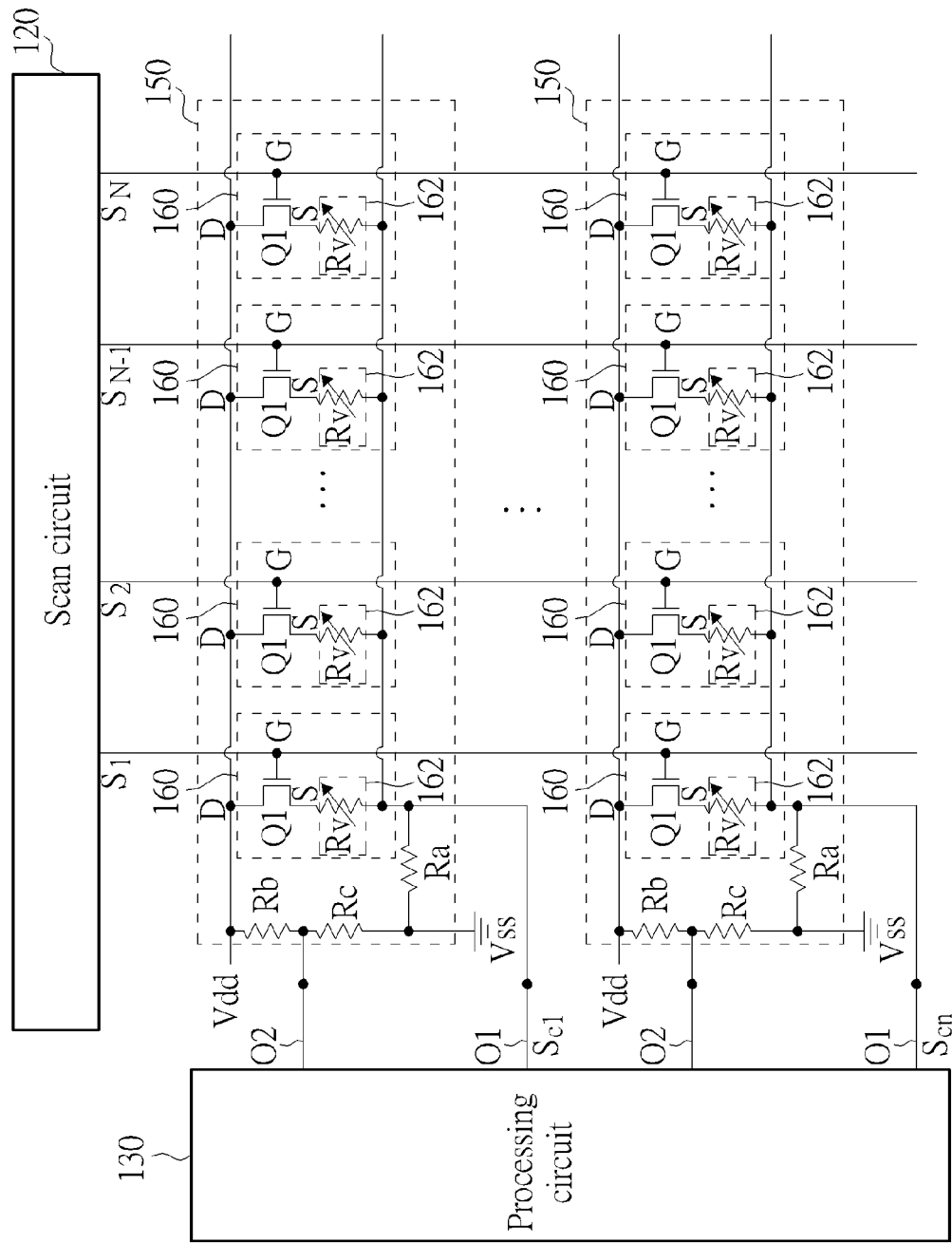
FIG. 4 is a schematic diagram of a portion of the circuit of the flexible display in FIG. 2.

Please refer to FIG. 4. FIG. 4 is a schematic diagram of a portion of the circuit of the flexible display 100 in FIG. 2. Each of the sensing circuits 150 comprises a first signal line O1, a first resistor Ra and a plurality of sensing units 160. The first resistor Ra is electrically coupled between the first signal line O1 and a first system voltage Vss, and the sensing units 160 are electrically coupled between the first signal line O1 and a second system voltage Vdd. The sensing circuits 150 provide the deformation signals $S_{c1}$ to $S_{cn}$ via the first signal lines O1. The first system voltage Vss may be a grounded voltage, and the second system voltage Vdd may be a positive voltage. Each of the sensing units 160 comprises a first transistor Q1 and a strain sensor 162. The first transistor Q1 is electrically coupled to the strain sensor 162. The strain sensor 162 is configured to sense the strain and/or stress applied to the flexible display 100 at a position where the strain sensor 162 is located thereon. The first transistor Q1 is configured to turn on/off the strain sensor 162. The strain sensor 162 may comprises a sensing resistor or other components which have one or more physical properties that are varied along with the strain and/or stress applied thereon. The flexible display 100 obtains at least a curvature thereof via the strain sensors 162 of the sensing units 160.

In detail, in an embodiment of the present invention, the resistance of each strain sensor 162 is varied with the strength of the strain and/or stress applied on the strain sensor 162, such that the resistance of the strain sensor 162 may be used as reference for determining the strain and/or stress of the strain sensor 162. In an embodiment of the present invention, each of the strain sensors 162 may comprise a sensing resistor Rv, and the sensing resistor Rv may be made of metal (e.g. Molybdenum (Mo), Aluminium (Al), Titanium (Ti), etc.) or semiconductor (e.g. Indium Tin Oxide (ITO), poly silicon, etc.).

In an embodiment of the present invention, the flexible display 100 may further comprise a scan circuit 120 and a processing circuit 130. The scan circuit 120 is configured to provide a scan signal $V_S$ to the sensing units 160 of the sensing circuits 150 via scan lines $S_1$ to $S_N$ sequentially, such that the processing circuit 130 may obtain at least a curvature of the flexible display 100 according to the deformation signals $S_{c1}$ to $S_{cn}$ outputted from the first signal lines O1 of the sensing circuits 150. The first transistor Q1 has a control end G, a first end D and a second end S. The control end G is configured to receive the scan signal $V_S$ from the scan circuit 120, the first end D is electrically coupled to the second system voltage Vdd, and the second end S is electrically coupled to the strain sensor 162. In the embodiment, the first transistor Q1 may be a N-type metal-oxide-semiconductor field-effect-transistor (NMOSFET), and the control end G, the first end D and the second end S are respectively the gate, the drain and the source of the first transistor Q1. However, the present invention is not limited thereto, and the first transistor Q1 may be a transistor of other type. For example, the first transistor Q1 may be a P-type metal-oxide-semiconductor field-effect-transistor (PMOSFET), an NPN-type bipolar junction transistor (NPN BJT), a PNP-type bipolar junction transistor (PNP BJT), etc.

Figure 5:
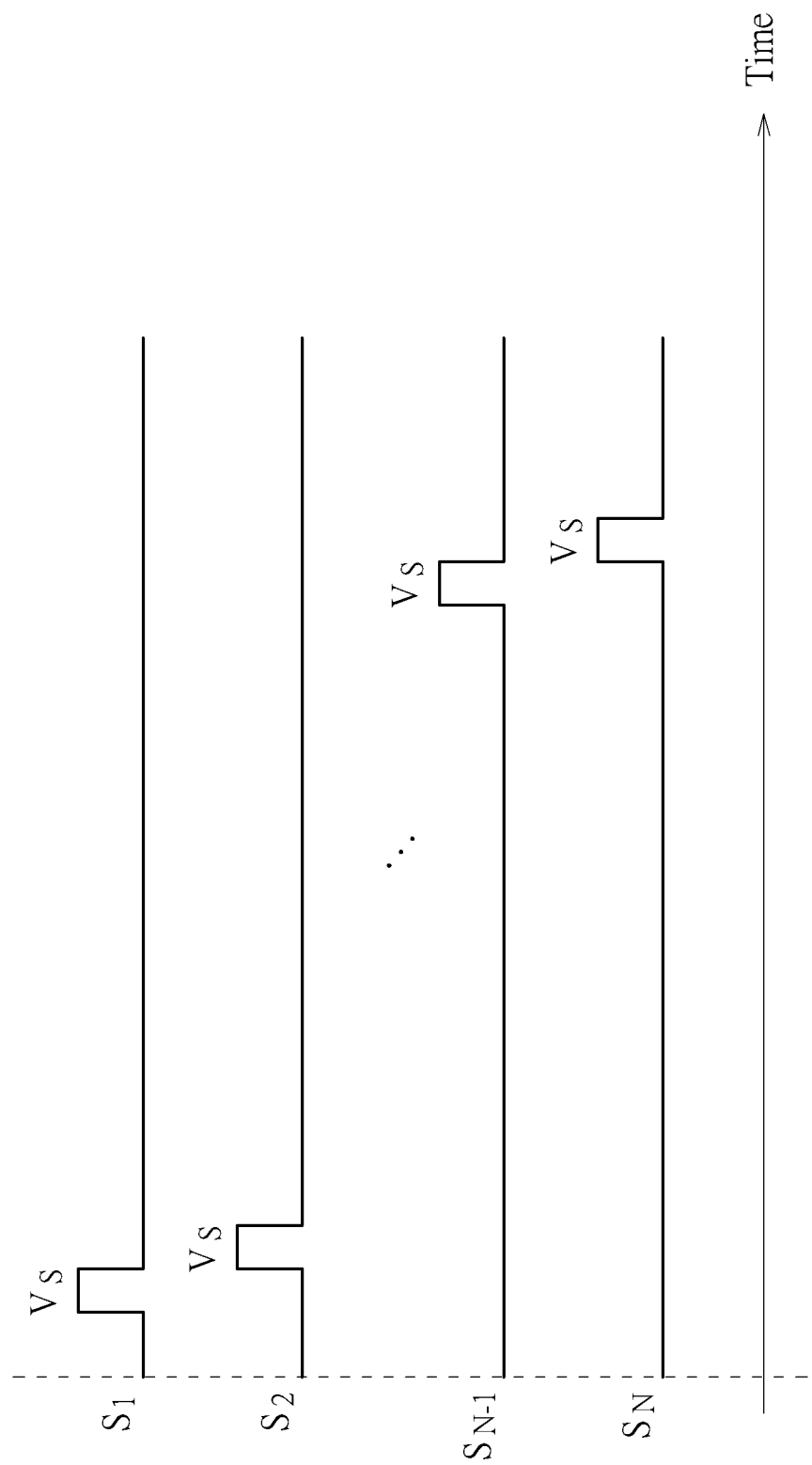
FIG. 5 is a timing diagram of voltage signals of a plurality of scan lines in FIG. 4.

Please refer to FIG. 5 with reference of FIG. 4. FIG. 5 is a timing diagram of voltage signals of the scan lines $S_1$ to $S_N$ in FIG. 4. As shown in FIG. 5, the voltage levels of the scan lines $S_1$ to $S_N$ are sequentially pulled up to the voltage level of the scan signal $V_S$ to sequentially turn on the first transistors Q1 coupled to the scan lines $S_1$ to $S_N$. In each sensing circuit 150, only one of the first transistors Q1 of the sensing units 160 is turned on at a time. When the scan circuit 120 finishes providing the scan signal $V_S$ to the last scan line $S_N$, the scan circuit 120 provides the scan signal $V_S$ to the first scan line $S_1$ again. The duration for scanning each of the scan lines $S_1$ to $S_N$ once by the scan circuit 120 may be named as a "scan period". The length of scan period may be adjusted according to different specifications of the flexible display 100 or demand of the user. In an embodiment of the present invention, the scan period of the scan circuit 120 may be adjusted within a range between $1/120$ seconds to $1/15$ seconds, but the present invention is not limited thereto. Additionally, it is be noted that the waveforms of the voltage levels of the scan lines $S_1$ to $S_N$ are suitable in the embodiments where the first transistors Q1 are NMOSFETs or NPN BJTs. In other embodiments of the present invention where the first transistors Q1 are PMOSFETs or PNP BJTs, the waveforms of the voltage levels of the scan lines $S_1$ to $S_N$ are complementary to the waveforms shown in FIG. 5. In other words, if the first transistors Q1 are PMOSFETs or PNP BJTs, the portions of the waveforms at a low level in FIG. 5 should be became to be at the voltage level of the scan signal $V_S$, and the portions of the waveforms at the voltage level of the scan signal $V_S$ in FIG. 5 should be became to be at the low level.

Figure 6:
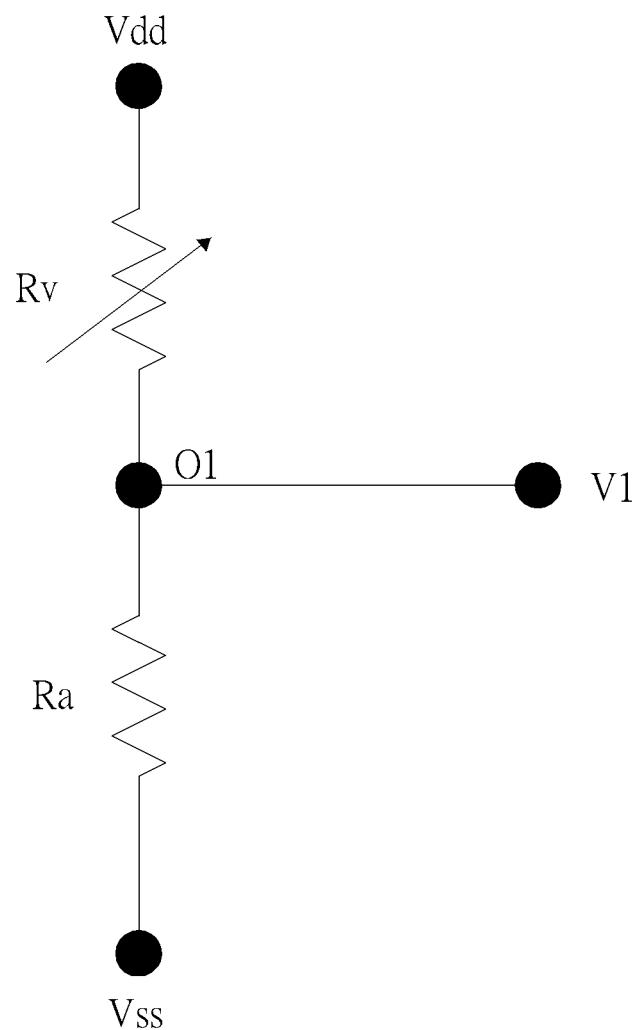

When one of the first transistors Q1 is turned on, the voltage level of the first signal line O1 coupled to the first transistor Q1 (i.e. the voltage level of one of the deformation signals $S_{c1}$ to $S_{cn}$) is equal to a divided voltage between the sensing resistor Rv and the first resistor Ra of the strain sensor 162. Please refer to FIG. 6. FIG. 6 is an equivalent circuit diagram of the sensing resistor Rv and the first resistor Ra in FIG. 4 when the corresponding first transistor Q1 is turned on. A voltage level V1 of the first signal line O1 may be presented as follows:

$$V1 = \frac{Ra \times (Vdd - Vss)}{Rv + Ra} + Vss$$

When the first system voltage Vss is a grounded voltage, the voltage level V1 of the first signal line O1 may be presented as follows:

$$V1 = \frac{Ra \times Vdd}{Rv + Ra}$$

Because the resistance of the first resistor Ra is substantially fixed, if the resistance of the first resistor Ra and the second system voltage Vdd are known, the processing circuit 130 may calculate the resistance of the sensing resistor Rv according to the voltage level V1 of the first signal line O1 (i.e. the voltage level of one of the deformation signals $S_{c1}$ to $S_{cn}$), and the processing circuit 130 may calculate the strain of the sensing resistor Rv according to the resistance of the sensing resistor Rv. Moreover, since the scan circuit 120 sequentially provides the scan signal $V_S$ to the scan lines $S_1$ to $S_N$ to sequentially turn on the first transistors Q1 coupled to the scan lines $S_1$ to $S_N$, the processing circuit 130 may calculate the resistance of each of the sensing resistors Rv according to the voltage level V1, which is measured at different time points within one of the scan periods of the scan circuit 120, of each of the first signal lines O1. In addition, since the strains of the sensing resistors Rv may be different, the values of the voltage level V1 of each of the first signal lines O1 may be different at different time points within one of the scan periods of the scan circuit 120. Accordingly, within a scan period of the scan circuit 120, the processing circuit 130 may calculate the resistance of each of the sensing resistors Rv according to the variations of the voltage level V1 of each of the first signal lines O1, and may calculate the strains of different portions of the flexible display 100 and at least a curvature of the flexible display 100 according to the resistance of each of the sensing resistors Rv.

Figure 7:
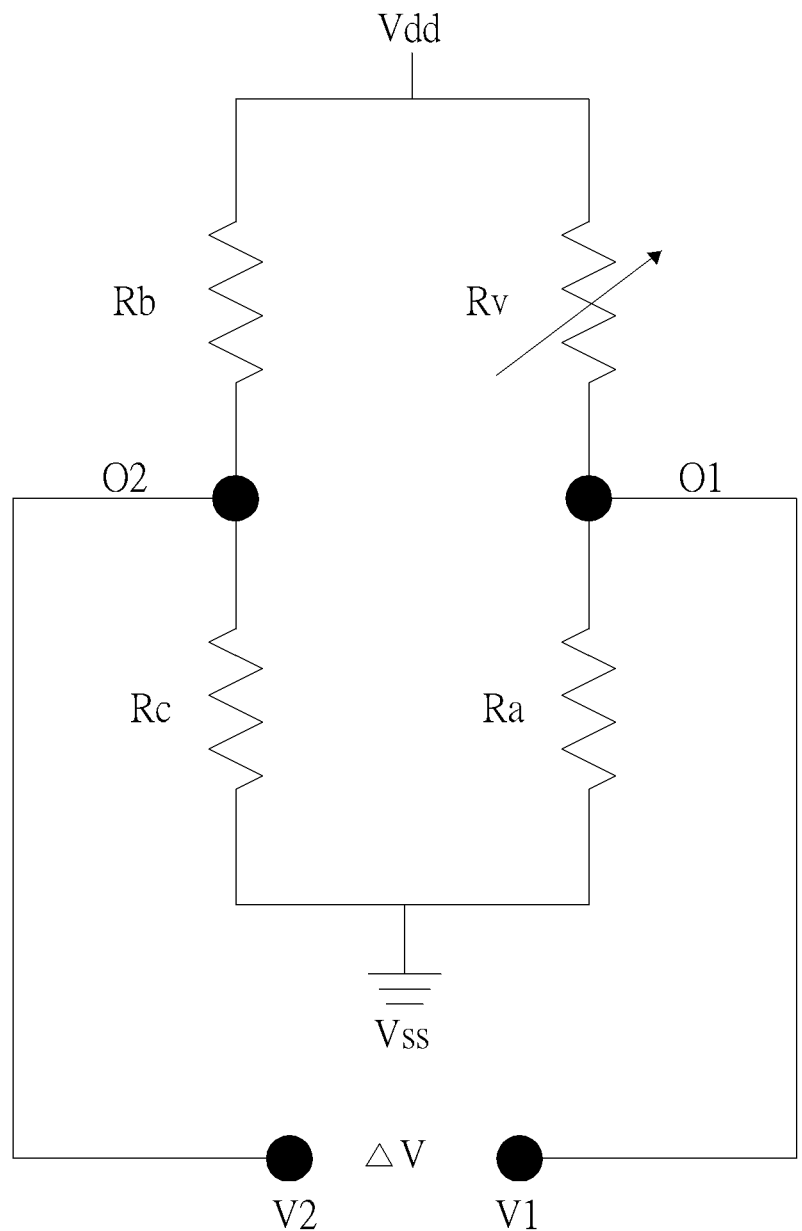

Please refer to FIG. 4 again. Each of the sensing circuit 150 may further comprise a second signal line O2, a second resistor Rb and a third resistor Rc. The second signal line O2 is electrically coupled to the processing circuit 130, and the resistances of the second resistor Rb and the third resistor Rc are substantially fixed. The second resistor Rb is electrically coupled between the second system voltage Vdd and the second signal line O2, and the third resistor Rc is electrically coupled between the second signal line O2 and the first system voltage Vss. In other words, an end of the second resistor Rb is biased by the second system voltage Vdd, and an end of the third resistor Rc is biased by the first system voltage Vss. The processing circuit 130 may calculate at least a curvature of the flexible display 100 according to a voltage difference between the first signal line O1 and the second signal line O2 of each of the sensing circuit 150. Please refer to FIG. 7 with reference of FIG. 4. FIG. 7 is an equivalent circuit diagram of the sensing resistor Rv, the first resistor Ra, the second resistor Rb and the third resistor Rc in FIG. 4 when the corresponding first transistor Q1 is turned on. If the voltage level of the second signal line O2 is presented as V2, when the first system voltage Vss is a grounded voltage, the voltage difference $\Delta V$ between the first signal line O1 and the second signal line O2 may be presented as follows:

$$\Delta V = \frac{Rv \times Rc - Ra \times Rb}{(Rv + Ra)(Rb + Rc)} \times Vdd$$

Because the resistances of the first resistor Ra, the second resistor Rb and the third resistor Rc are substantially fixed, if the second system voltage Vdd and the resistances of the first resistor Ra, the second resistor Rb and the third resistor Rc are known, the processing circuit 130 may calculate the resistance of the sensing resistor Rv according to the voltage difference $\Delta V$, and may calculate the strain of the sensing resistor Rv according to the resistance of the sensing resistor Rv. Moreover, since the scan circuit 120 sequentially provides the scan signal $V_S$ to the scan lines $S_1$ to $S_N$ to sequentially turn on the first transistors Q1 coupled to the scan lines $S_1$ to $S_N$, the processing circuit 130 may calculate the resistance of each of the sensing resistors Rv according to the voltage difference $\Delta V$ measured at different time points within one of the scan periods of the scan circuit 120. In addition, since the strains of the sensing resistors Rv may be different, the values of the voltage difference $\Delta V$ measured at different scan time points may be different. Accordingly, within a scan period of the scan circuit 120, the processing circuit 130 may calculate the resistance of each of the sensing resistors Rv according to the variations of the voltage difference $\Delta V$ between the first signal line O1 and the second signal line O2 of each of the sensing circuits 150, and the processing circuit 130 may calculate the strains of different portions of the flexible display 100 and at least a curvature of the flexible display 100 according to the resistance of each of the sensing resistors Rv.

How to calculate the strains of different portions of the flexible display 100 and at least a curvature of the flexible display 100 according to the resistance of each of the sensing resistors Rv would be further explained in the following descriptions. If the resistance of the sensing resistor Rv is R while the sensing resistor Rv does not suffer any exterior strain, and the difference of the resistance of the sensing resistor Rv is $\Delta R$ while the sensing resistor Rv suffers an exterior strain, the strain $\epsilon$ of the sensing resistor Rv may be presented as follows:

$$\varepsilon = \frac{\Delta R}{R \times Gf}$$

Wherein, Gf is the gauge factor. Moreover, the curvature K of the flexible display 100 at the position where the sensing resistor Rv is located thereon may be presented as follows:

$$\kappa = \frac{\varepsilon}{y}$$

Wherein, y is the distance between the sensing resistor Rv and a zero-strain surface of the flexible display 100.

Figure 8:
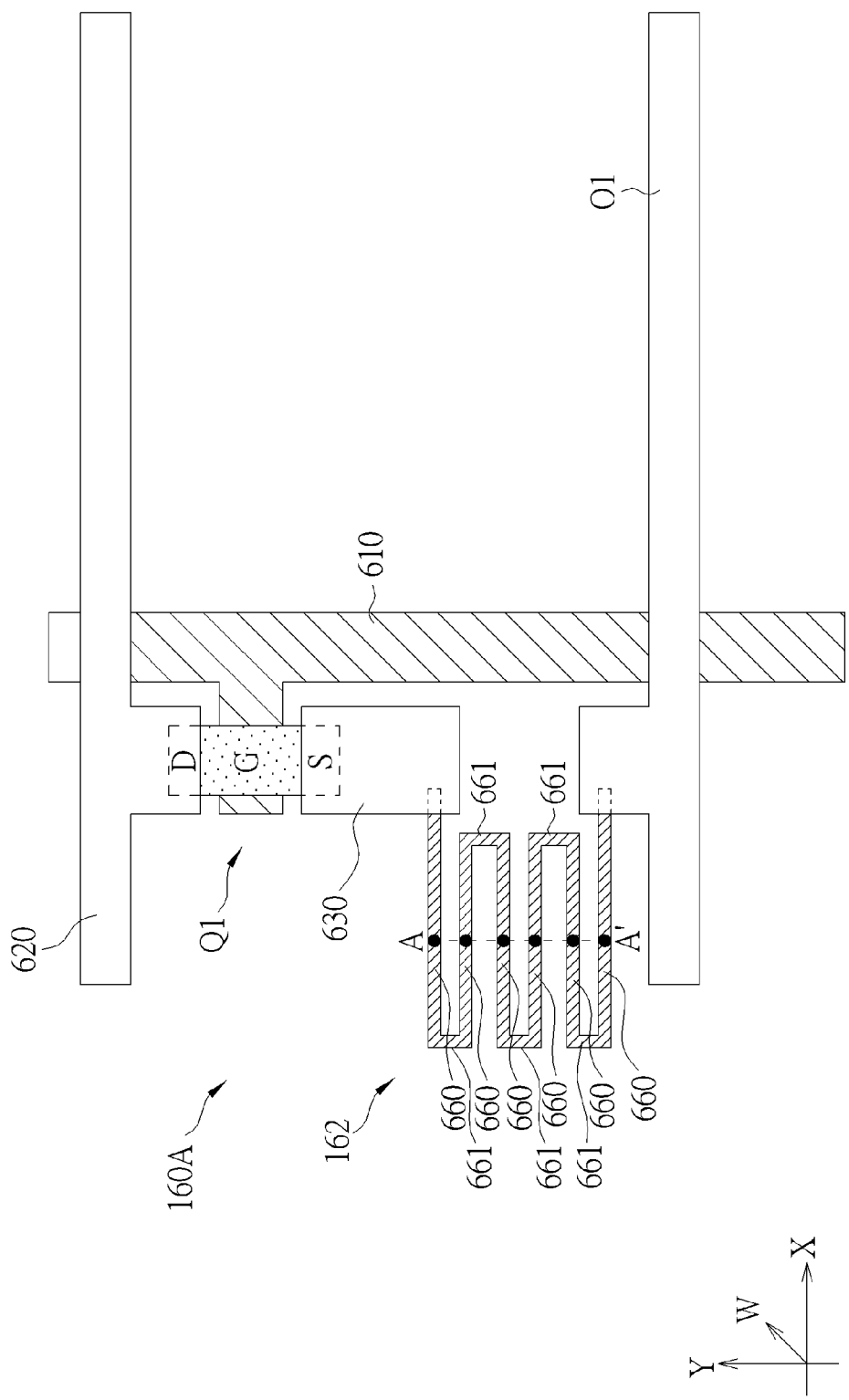
FIG. 8 is a layout diagram of a first sensing unit according to an embodiment of the present invention.
Figure 9:
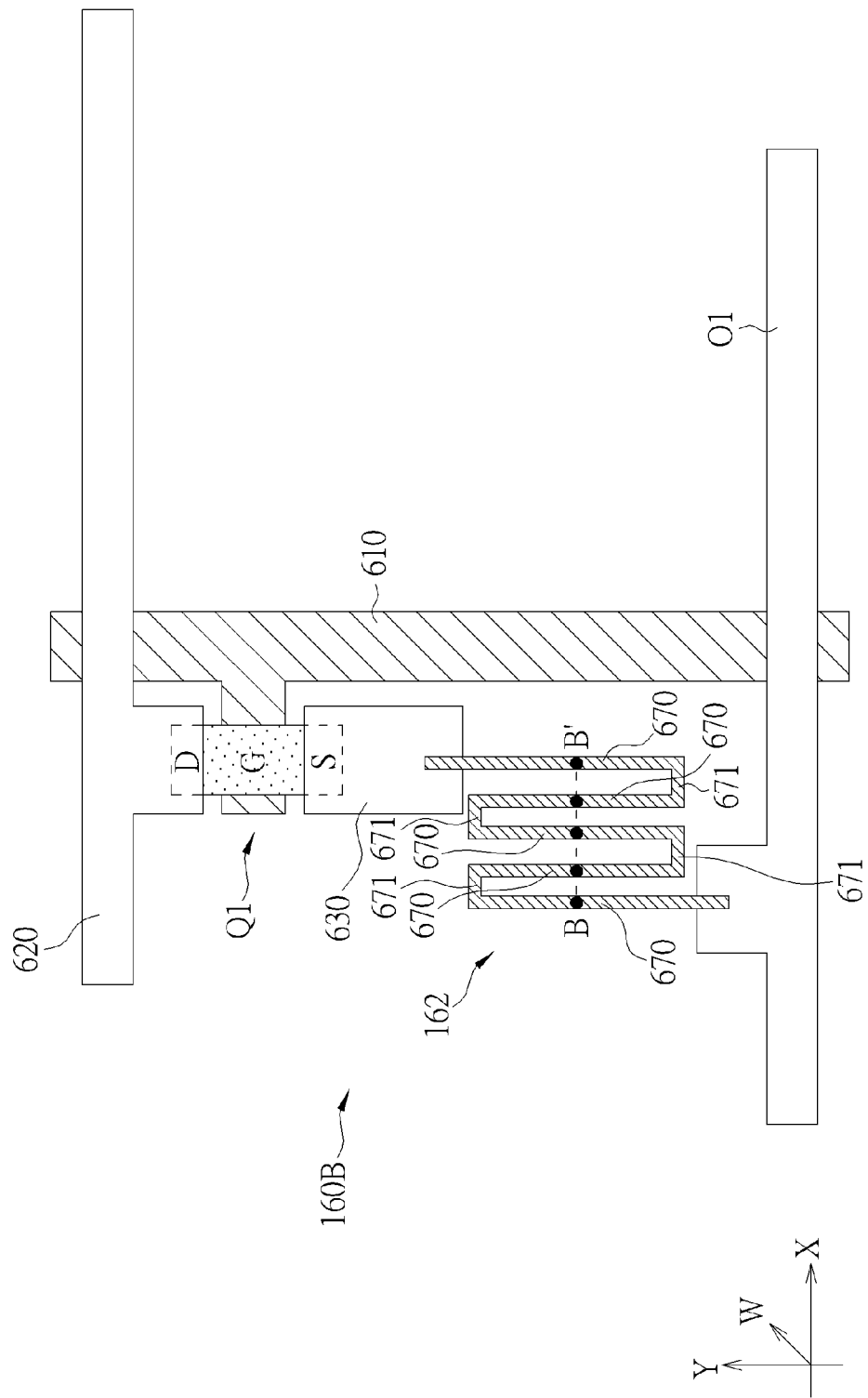
FIG. 9 is a layout diagram of a second sensing unit according to an embodiment of the present invention.
Figure 10:
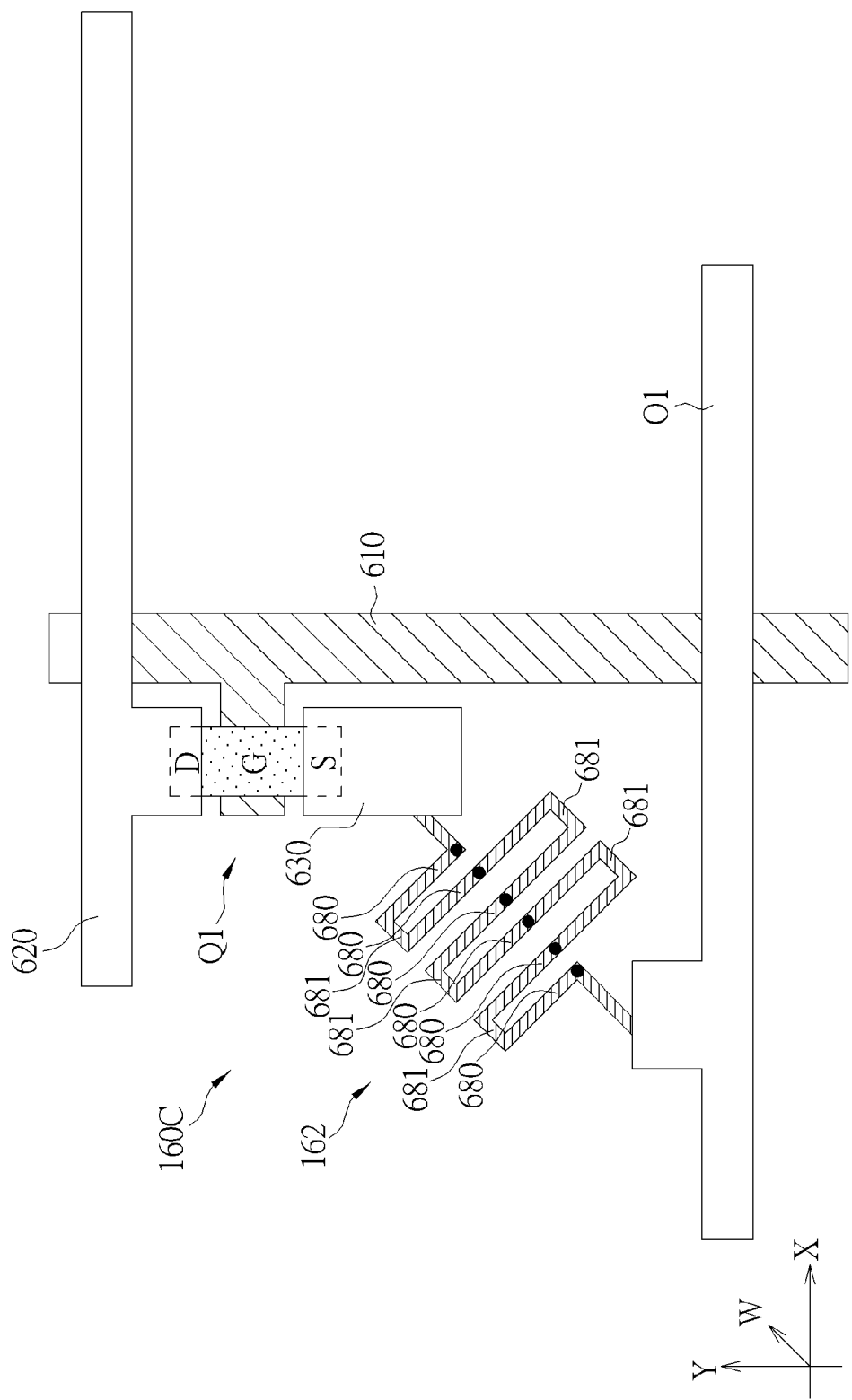
FIG. 10 is a layout diagram of a third sensing unit according to an embodiment of the present invention.

In an embodiment of the present invention, the sensing units 160 of the flexible display 100 may have different types, e.g. the first sensing unit 160A in FIG. 8, the second sensing unit 160B in FIG. 9 and/or the third sensing unit 160C in FIG. 10. The first sensing unit 160A, the second sensing unit 160B and the third sensing unit 160C are configured to sense strains and/or stresses applied to the flexible display 100 along a first direction X, a second direction Y and a third direction W respectively. The first direction X, the second direction Y and the third direction W may be any three un-parallel directions. In an embodiment of the present invention, the second direction Y is substantially perpendicular to the first direction X, and the third direction W is lain between the first direction X and the second direction Y. In an embodiment of the present invention, the angle between the first direction X and the third direction W and the angle between the second direction Y and the third direction W are substantially 45°. However, the present invention is not limited thereto. In addition, the areas 610, 620 and 630 of each of the sensing units forms the gate, the drain and the source of the first transistor Q1. The strain sensor 162 of the first sensing unit 160A comprises a plurality of first sections 660 connected in series. The strain sensor 162 of the first sensing unit 160A further comprises a plurality of first connection sections 661. Each of the first connection sections 661 connects two of the first sections 660. The first connection sections 661 are perpendicular to or substantially perpendicular to the first sections 660. The first sections 660 and the first connection sections 661 are connected in series in an S-shape. The first sections 660 are substantially perpendicular to the first direction X, and a straight line (e.g. line $\overline{AA'}$) through the centers of two of the first sections 660 is substantially perpendicular to the first direction X. The strain sensor 162 of the second sensing unit 160B comprises a plurality of second sections 670 connected in series, and the second sections 670 are substantially perpendicular to the second direction Y. A straight line (e.g. line $\overline{BB'}$) through the centers of two of the second sections 670 is substantially perpendicular to the second direction Y. The strain sensor 162 of the second sensing unit 160B further comprises a plurality of second connection sections 671. Each of the second connection sections 671 connects two of the second sections 670. The second connection sections 671 are perpendicular to or substantially perpendicular to the second sections 670. The second sections 670 and the second connection sections 671 are connected in series in an S-shape. The strain sensor 162 of the third sensing unit 160C comprises a plurality of third sections 680 connected in series, and the third sections 670 are substantially perpendicular to the third direction W. The strain sensor 162 of the third sensing unit 160C further comprises a plurality of third connection sections 681. Each of the third connection sections 681 connects two of the third sections 680. The third connection sections 681 are perpendicular to or substantially perpendicular to the third sections 680. The third sections 680 and the third connection sections 681 are connected in series in an S-shape.

Since the strain sensors 162 have different patterns, the strains of the flexible display 100 along different directions would be sensed more easily. According to the method of the Mohr's circle, the directions and strength of the principle strains $\varepsilon_{11}$ and $\varepsilon_{22}$, may be calculated according to the strains along three different directions:

$$\varepsilon_{11} = \frac{1}{2}\left[\varepsilon_X + \varepsilon_Y + \sqrt{2[(\varepsilon_X - \varepsilon_W)^2 + (\varepsilon_W - \varepsilon_Y)^2]}\right]$$

$$\varepsilon_{22} = \frac{1}{2}\left[\varepsilon_X + \varepsilon_Y - \sqrt{2[(\varepsilon_X - \varepsilon_W)^2 + (\varepsilon_W - \varepsilon_Y)^2]}\right]$$

Wherein, $\varepsilon_X$, $\varepsilon_Y$ and $\varepsilon_W$ are the strains of the flexible display 100 along the first direction X, the second direction Y and the third direction W respectively. In addition, the principle strains and/or stresses $\sigma_{11}$ and $\sigma_{22}$ of the flexible display 100 may be presented as follows:

$$\sigma_{11} = \frac{E}{1-v^2}(\varepsilon_{11} + v\varepsilon_{22})$$

$$\sigma_{22} = \frac{E}{1-v^2}(\varepsilon_{22} + v\varepsilon_{11})$$

Wherein, E is the Young's modulus, and v is the Poisson's ratio.

Figure 11:
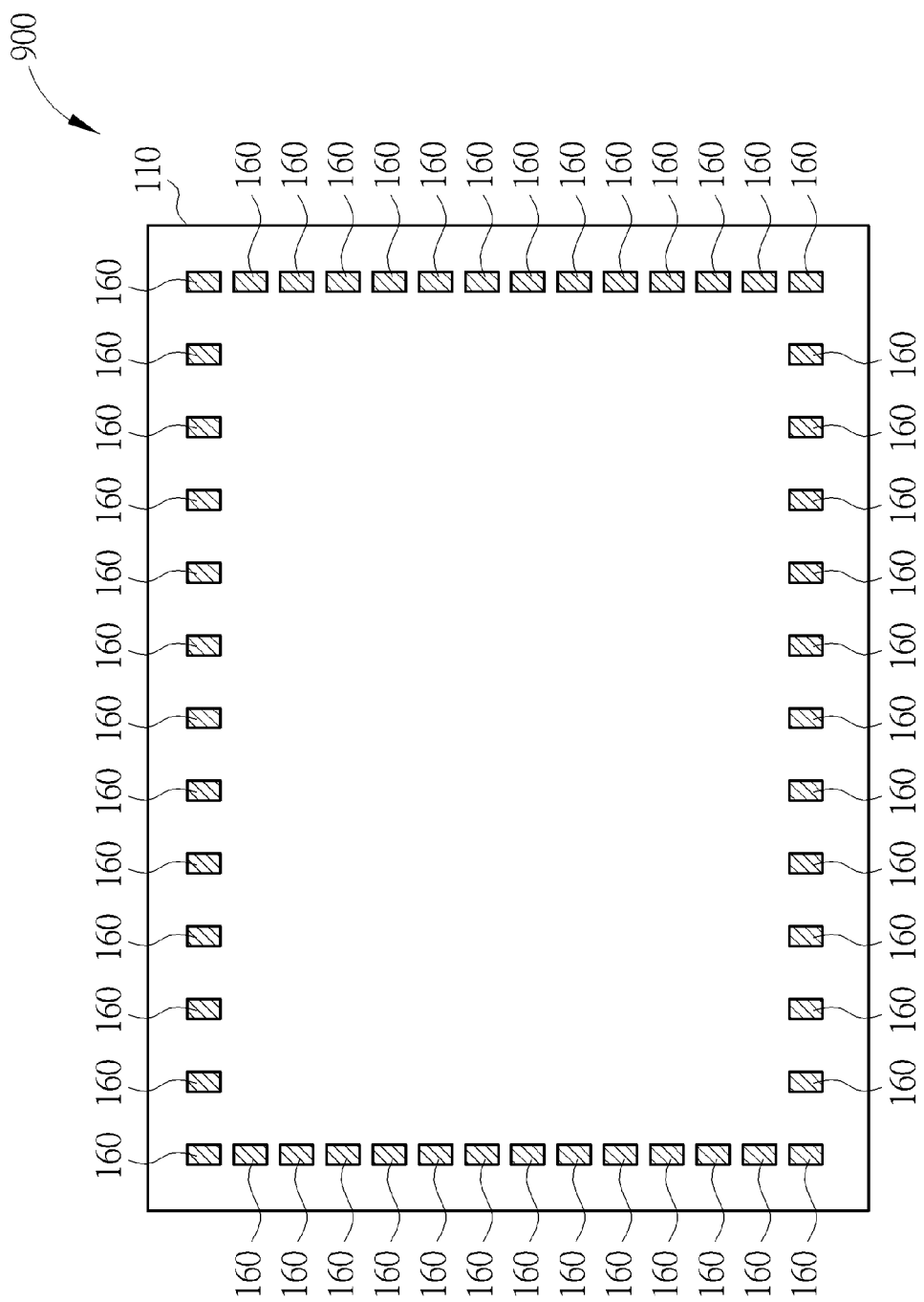
FIG. 11 is used to illustrate the layout of a plurality of sensing units of a flexible display according to an embodiment of the present invention.
Figure 12:
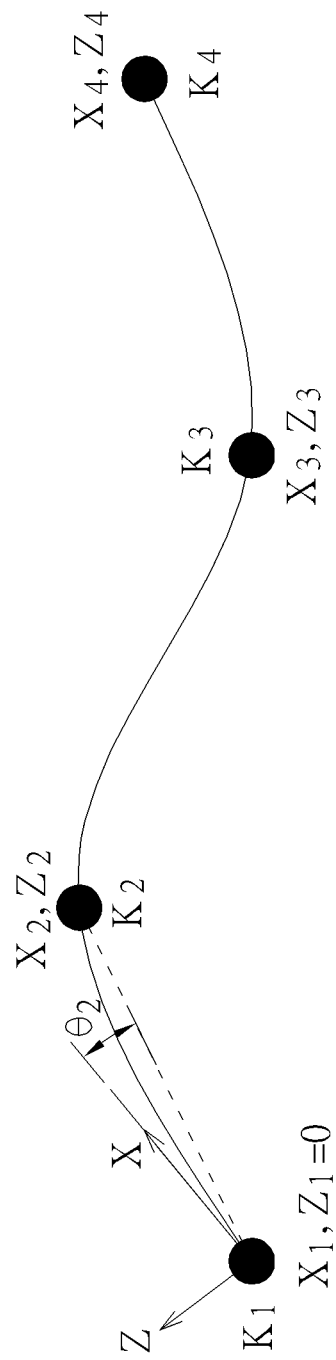
FIG. 12 is used to explain how to obtain geometry of a curve of the flexible display by using an interpolation algorithms according to an embodiment of the present invention.

As shown in FIG. 11, in an embodiment of the present invention, all of the sensing units 160 of another flexible display 900 are arranged along the edges of the flexible display 900 and distributed in the flexible display 900 in a ring-shape. The processing circuit 130 of the flexible display 900 may calculate a curvature function of each side of the flexible display 900 by using the sensing units 160 arranged along each side of the flexible display 900, obtain geometry of curves of three or four sides of the flexible display 900, and further obtain geometry of a twisted surface composed of the curves of the three or four sides according to the geometry of curves of three or four sides of the flexible display 900. Please refer to FIG. 12. FIG. 12 illustrates the curve of one side of the flexible display 900 and curvatures $K_1$, $K_2$, $K_3$ and $K_4$ corresponding to four sensing circuits 150 on the curve. X shown in FIG. 12 is the first direction, and Z is a fourth direction which is perpendicular to the first direction X and the second direction Y. The coordinates of the four sensing circuits 150 along the first direction X and the fourth direction Z are respectively $(X_1, Z_1)$, $(X_2, Z_2)$, $(X_3, Z_3)$ and $(X_4, Z_4)$, and the coordinates $(X_1, Z_1)$ is set as an origin. An angle between a connecting line of $(X_1, Z_1)$ and $(X_2, Z_2)$ and the first direction X is $\theta_2$. If the portion between the coordinates $(X_1, Z_1)$ and $(X_2, Z_2)$ is divided into n sections, similar geometry of the curve of the n sections between the coordinates $(X_1, Z_1)$ and $(X_2, Z_2)$ may be obtained by using an interpolation algorithms according to an embodiment of the present invention. In the same way, similar geometry of the curves between the coordinates $(X_2, Z_2)$ and $(X_3, Z_3)$ and between the coordinates $(X_3, Z_3)$ and $(X_4, Z_4)$ may be obtained by using the interpolation algorithms.

Figure 13:
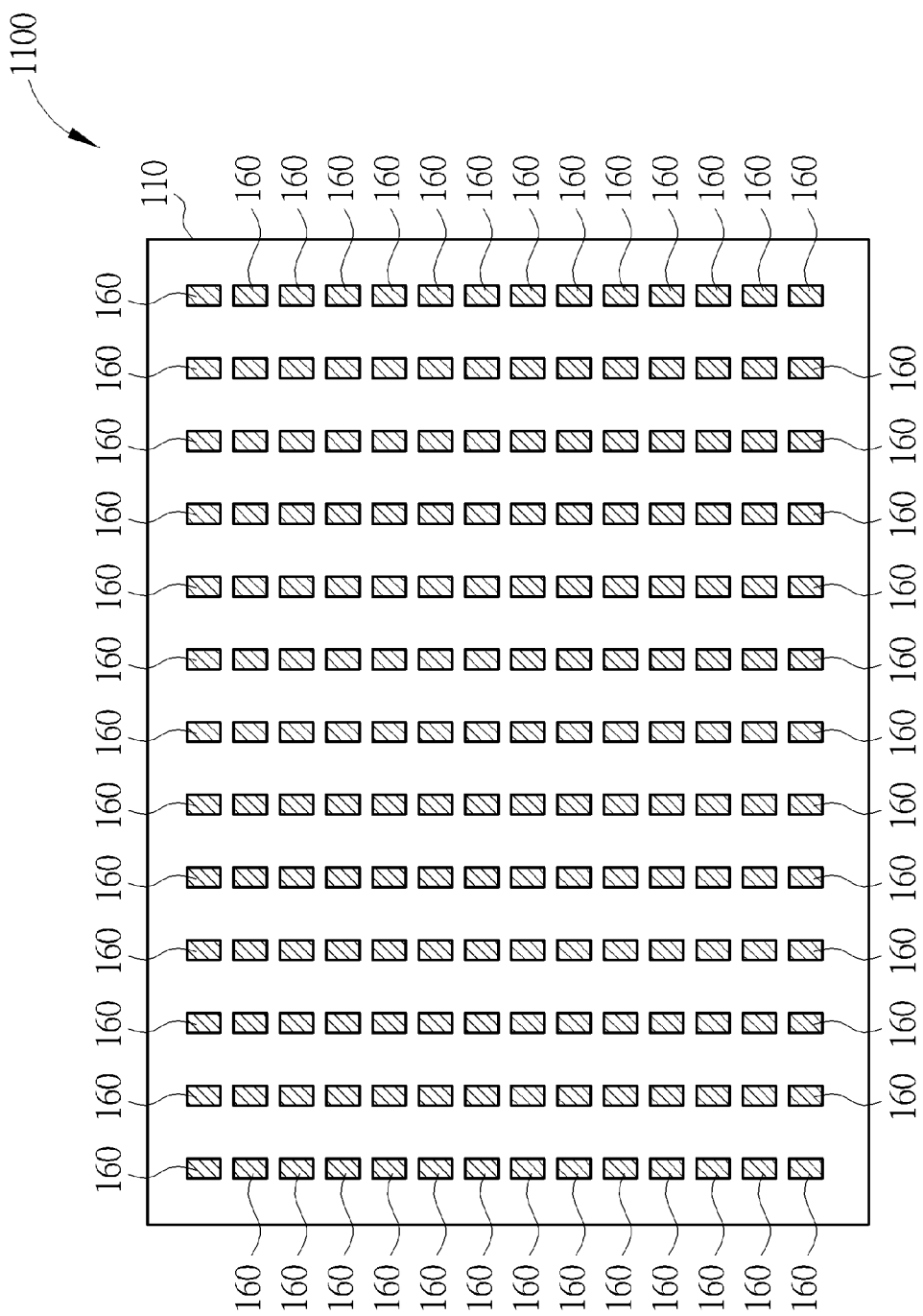
FIG. 13 is used to illustrate the layout of a plurality of sensing units of a flexible display according to another embodiment of the present invention.
Figure 14:
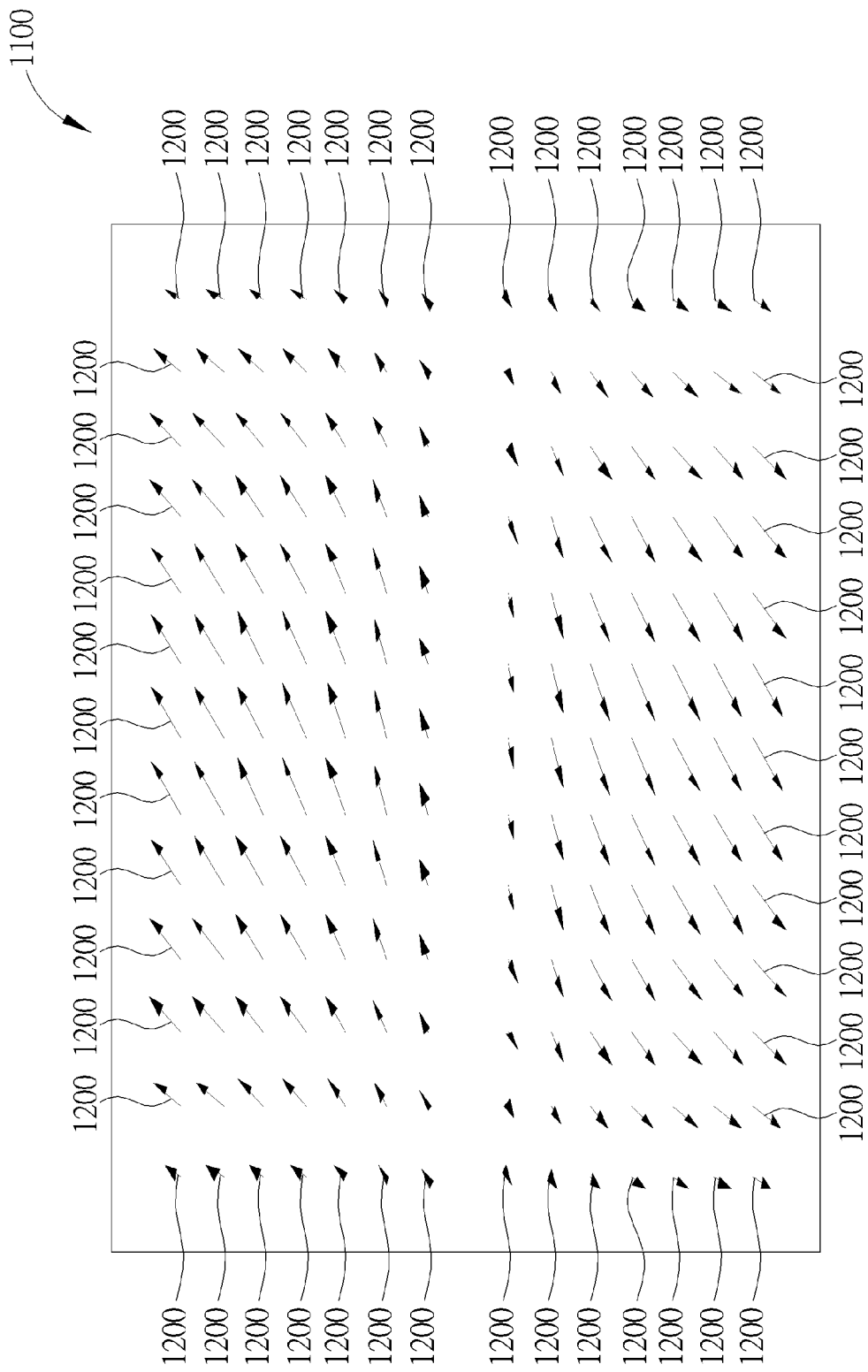
FIG. 14 illustrates curvature vectors of the sensing units in FIG. 13.
Figure 15:
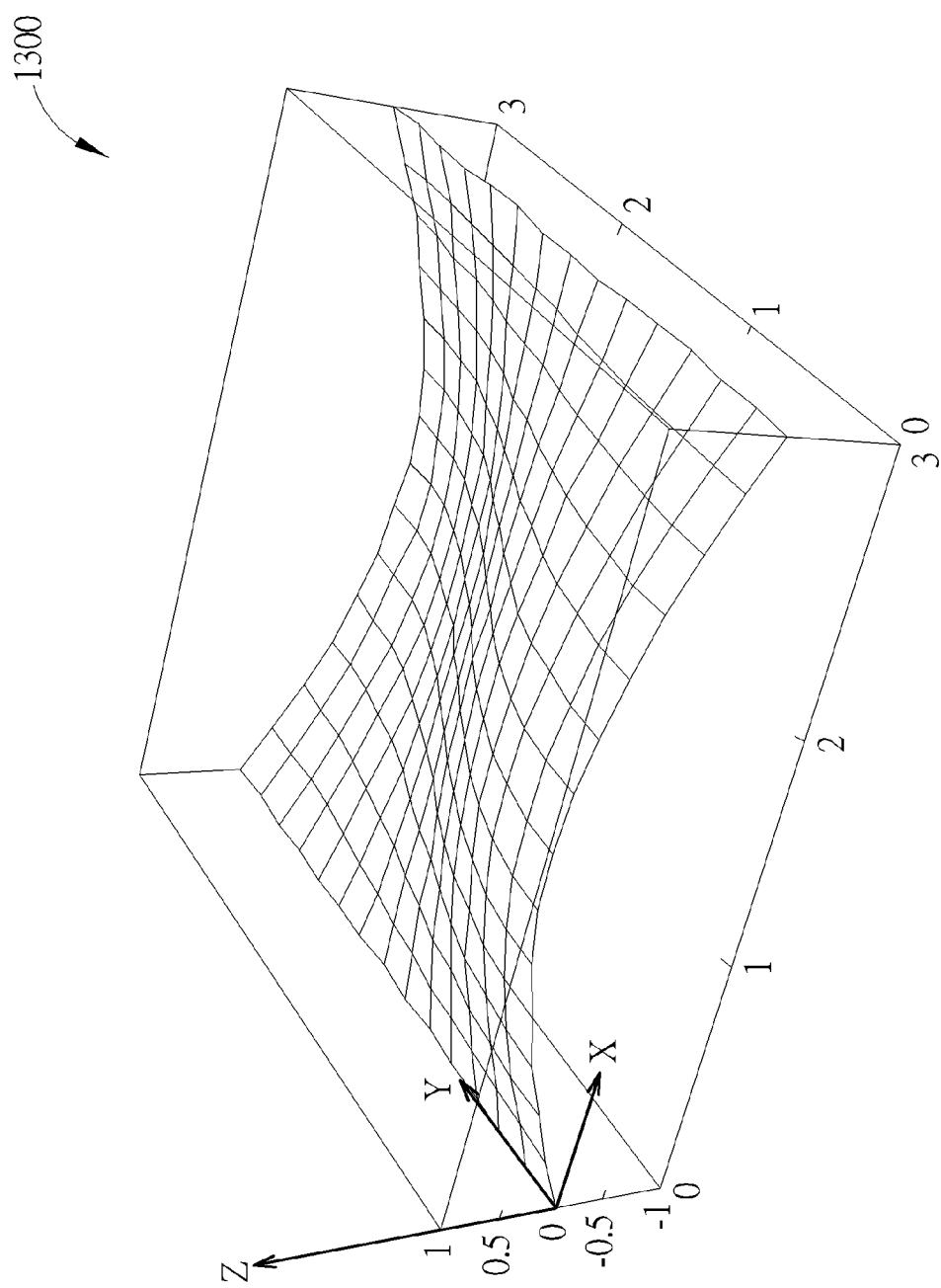
FIG. 15 is a three-dimensional diagram of the flexible display in FIG. 13.

Moreover, as shown in FIG. 13, all of the sensing units 160 of a flexible display 1100 according to another embodiment of the present invention are arranged in a matrix in the flexible display 1100. In the embodiment, each of the sensing units 160 comprises two groups connected in series for sensing strains along two different directions (e.g. the first direction X and the second direction Y), and each of the groups comprises the first transistor Q1 and the sensing resistor Rv. The processing circuit 130 senses the strains along the two different directions by using each of the sensing units 160 to obtain curvature vectors 1200 of each sensing unit 160 shown in FIG. 14 and/or a three-dimensional diagram of the flexible display 1100 shown in FIG. 15.

Figure 16:
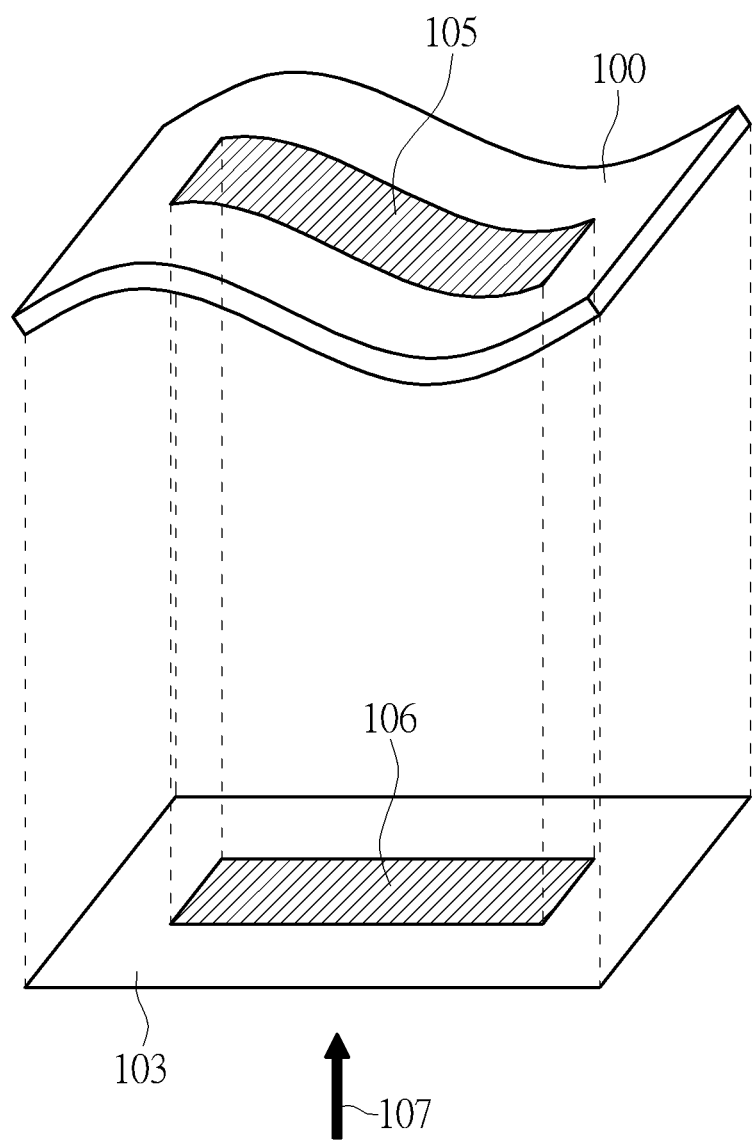
FIG. 16 is used to explain how to adjust the image displayed on the flexible display according to the calculated curvature of the flexible display in FIG. 1.

In an embodiment of the present invention, the processing circuit 130 adjusts an image displayed on the flexible display 100 according to the at least a curvature of the flexible display 100 or the curved status of the flexible display 100. Please refer to FIG. 16. FIG. 16 is used to explain how to adjust the image displayed on the flexible display 100 according to the calculated curvature of the flexible display 100 in FIG. 1. If the flexible display 100 is twisted and plans to display an image having a rectangle, the processing circuit 130 adjusts the image of the flexible display 100 according to the at least a curvature of the flexible display 100. Consequently, although the flexible display 100 displays a curved image 105 actually, the user still sees an image having a rectangle 106 displayed on a virtual plane 103 when the user sees the curved image 105 in the direction 107.

Moreover, in other embodiments of the present invention, the pixel control circuit 114 of each pixel 112 further comprises a second transistor Q2, and the first transistors Q1 and the second transistors Q2 are formed in the TFT layer 170 of the flexible display 100 by performing the same manufacture procedure. The flexible display 100 periodically provides scan signals to the gate of each of the second transistors Q2 to periodically turn on the second transistors Q2. When the second transistor Q2 is turned, the flexible display 100 applies a data voltage to the pixel electrode of the pixel 112 to refresh the display status (e.g. gray-level) of the pixel 112.

Figure 17:
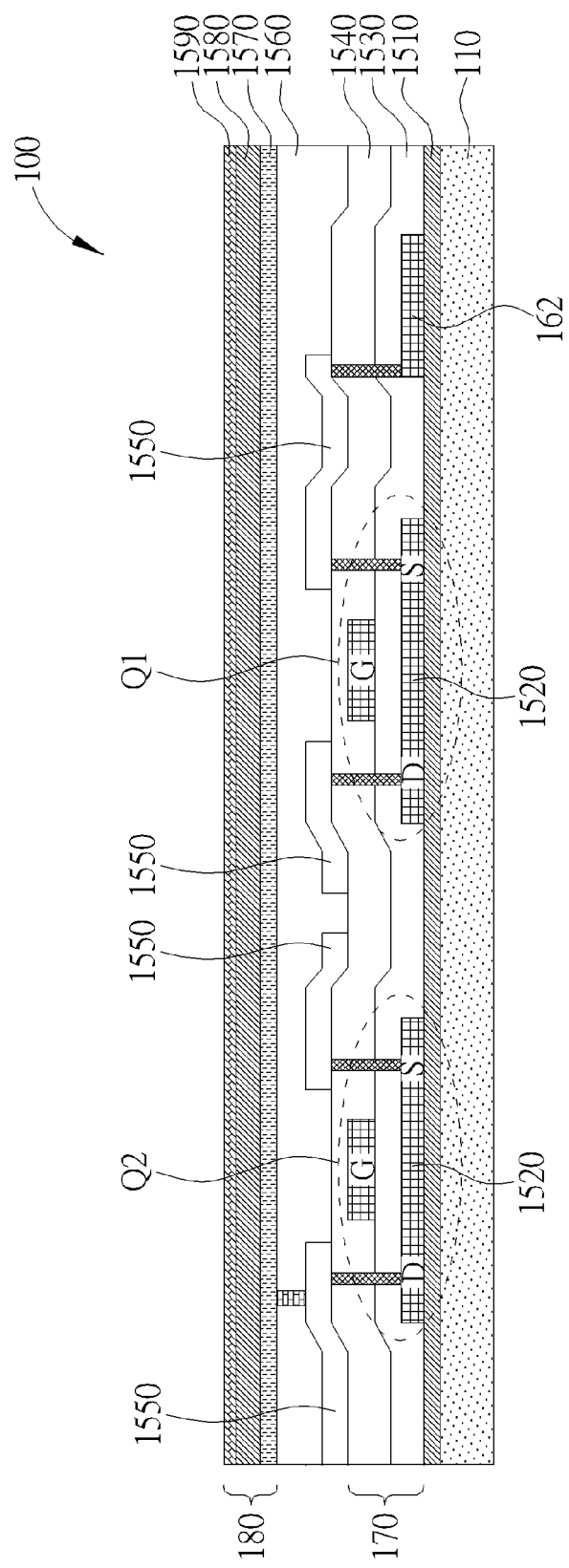
FIG. 17 to FIG. 19 are cross-section diagrams of flexible displays according to different embodiments of the present invention.

Please refer to FIG. 17. FIG. 17 is a cross-section diagram of the flexible display 100 according to an embodiment of the present invention. The structural layers of the flexible display 100 comprises a flexible substrate 110, a poly-silicon layer 1520, a passivation layer 1530, a gate insulator layer 1540, a metal layer 1550, a passivation layer 1560, an anode layer 1570, an OLED layer 1580 and a cathode layer 1590. The poly-silicon layer 1520, the passivation layer 1530, the gates G and the gate insulator layer 1540 form the TFT layer 170, and the anode layer 1570, the OLED layer 1580 and the cathode layer 1590 form the display layer 180. Moreover, a buffer layer 1510 may be formed between the flexible substrate 110 and the TFT layer 170, and the passivation layer 1560 may be formed between the TFT layer 170 and the display layer 180. The OLED layer comprises an emissive layer and a conductive layer which are made of specific organic materials. The sources S and the drains D of the second transistor Q2 of the pixel 112 and the first transistor Q1 of the sensing unit 160 are formed in the poly-silicon layer 1520 located between the buffer layer 1510 and the passivation layer 1530, and the gates of the second transistors Q2 and the first transistor Q1 are formed in a structural layer formed between the passivation layer 1530 and the gate insulator layer 1540. Moreover, the source S and the drain D of the second transistor Q2 and the strain sensor 162 are formed in the poly-silicon layer 1520 of the flexible display 100.

Figure 18:
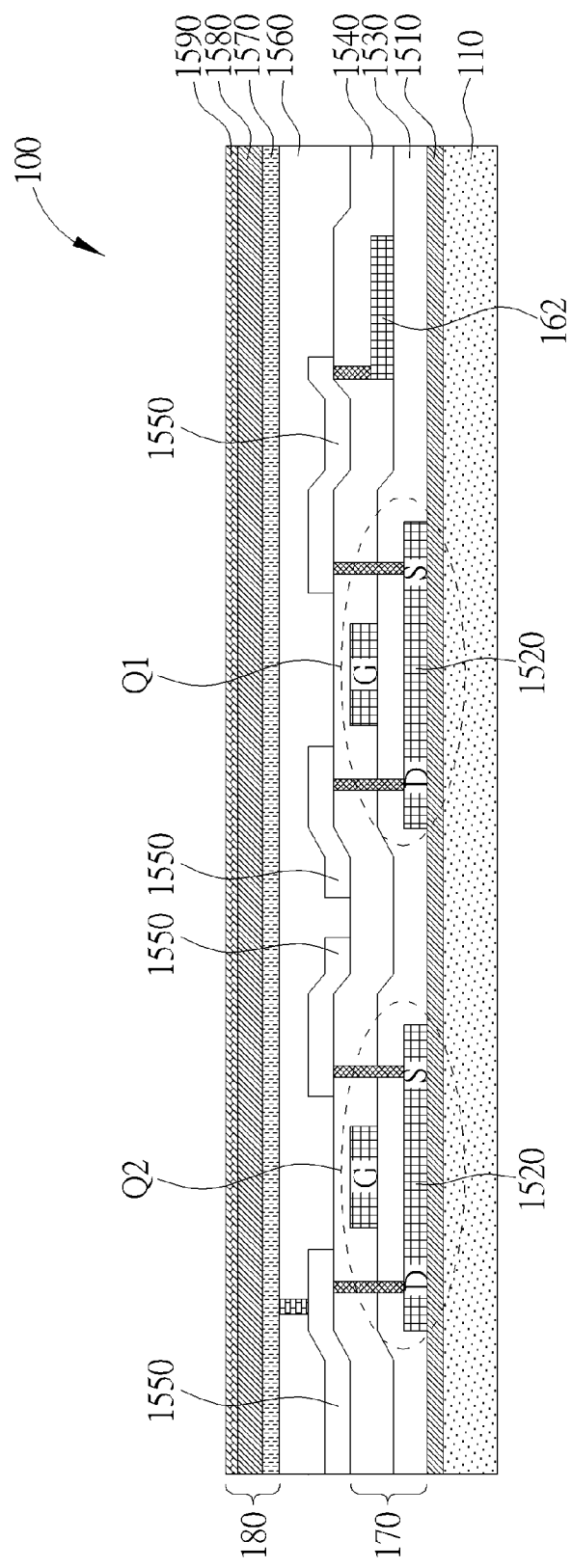
Figure 19:
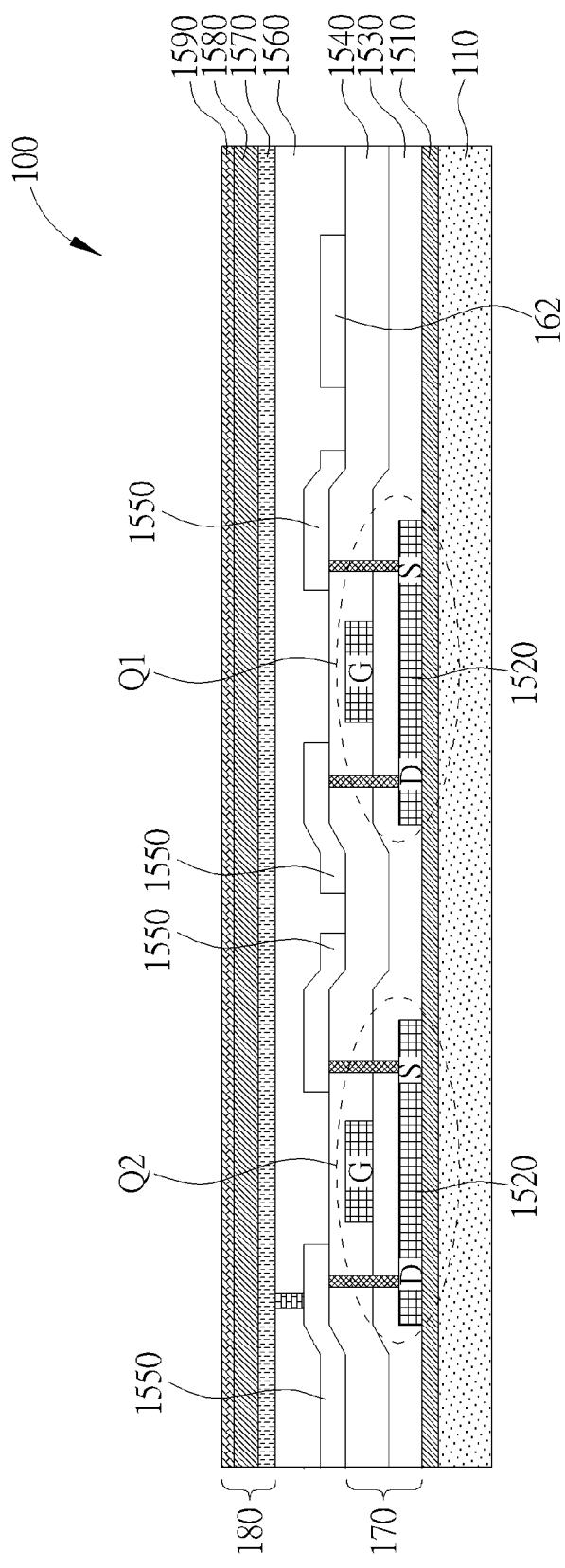

In other embodiments of the present invention, the strain sensors 162 may be formed in other structural layers of the flexible display 100. As shown in FIG. 18, the strain sensor 162 and the gate (i.e. the control end) G of the second transistor Q2 are formed in other structural layers of the flexible display 100. Moreover, as shown in FIG. 19, the source S and the drain D of the second transistor Q2 are electrically coupled to the metal layer 1550, and the strain sensor 162 is formed in the metal layer 1550. Based on the foresaid methods of forming the first transistor Q1 and the strain sensor 162 of the sensing unit 160, the first transistors of the sensing circuits 150 and the second transistors Q2 of the pixels 112 are formed in the same structural layer of the flexible display 100 without using any glue. Therefore, deviation of calculating the strains and the strains and/or stresses would be avoided since the deformation of the flexible display due to the glue does not exist anymore. Therefore, accuracy of calculating the curvature of the flexible display 100 is improved.

Figure 20:
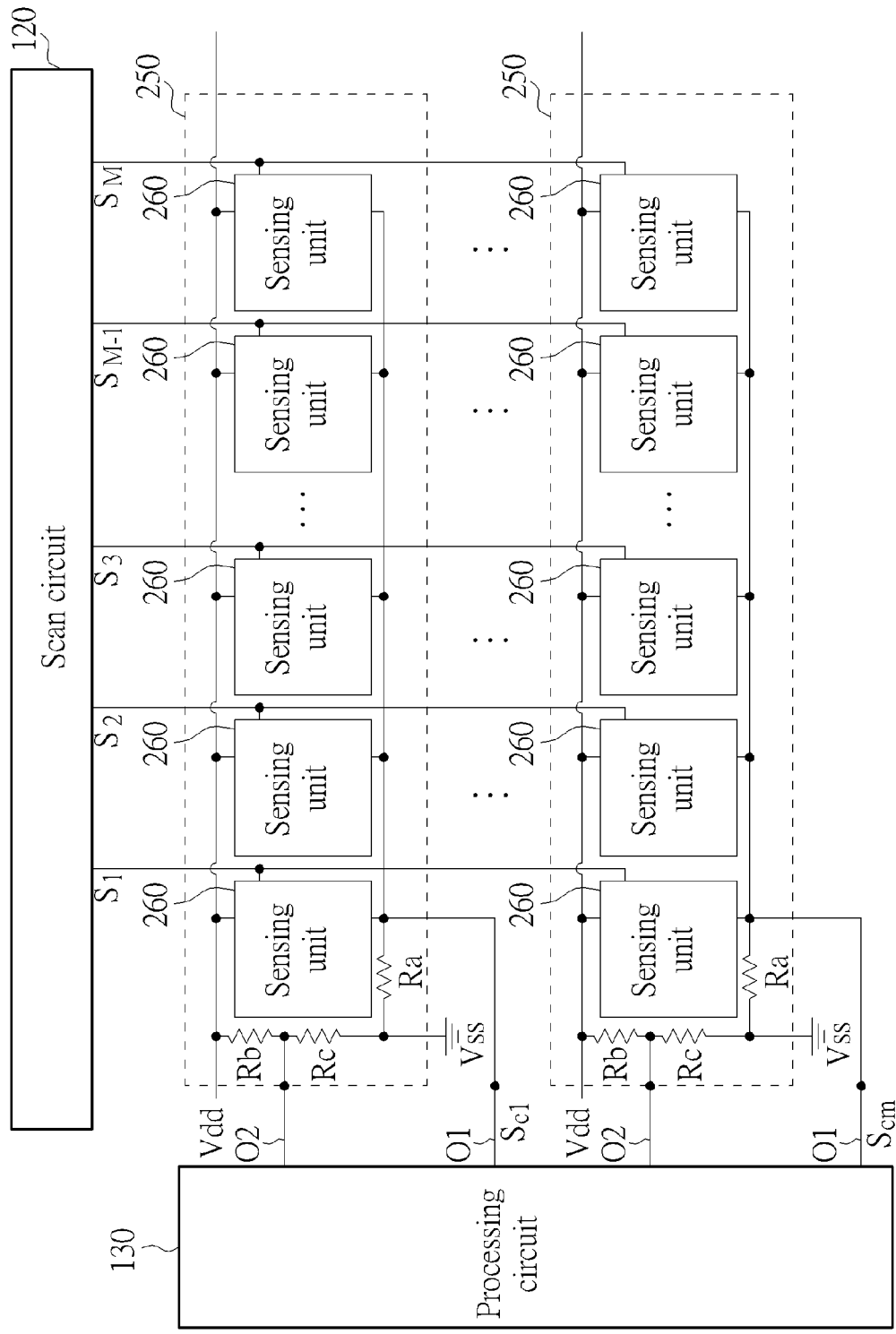
FIG. 20 is a schematic diagram of a portion of a circuit of a flexible display according to another embodiment of the present invention.
Figure 21:
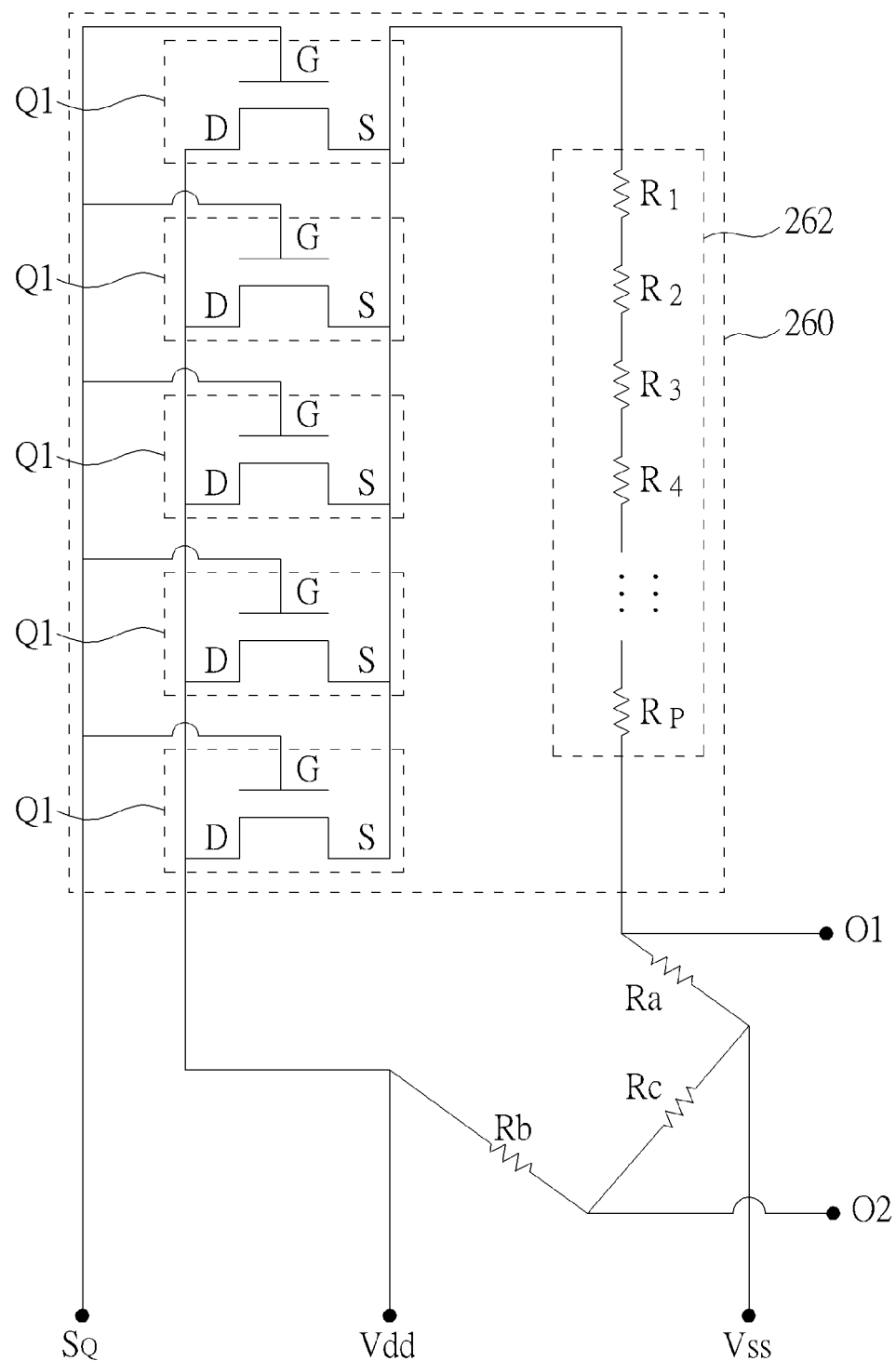
FIG. 21 is a circuit diagram of a sensing unit and related part of the flexible display in FIG. 20.

Moreover, in order to improve the sensitivity of the sensing unit 160 for sensing the strain and/or stress, the resistance of the strain sensor 162 and/or the width-to-length ratio (W/L) of the first transistor Q1 may be increased. In other embodiments of the present invention, the sensitivity of the sensing unit 160 for sensing the strain and/or stress is improved by serially connecting a plurality of strain sensing units and/or by connecting a plurality of the first transistors Q1 in parallel. Please refer to FIGS. 20 and 21. FIG. 20 is a schematic diagram of a portion of a circuit of a flexible display according to another embodiment of the present invention, and FIG. 21 is a circuit diagram of a sensing unit 260 and related part of the flexible display in FIG. 20. The structure of the flexible display in the embodiment is similar to that of the flexible display 100 illustrated in FIGS. 1 to 4, and the difference between the two flexible displays is that the sensing circuits 150 of the flexible display 100 are replaced by the sensing circuits 250 of the flexible display in the embodiment. Each of the sensing circuits 250 provides the deformation signals $S_{c1}$ to $S_{cm}$ according to the deformation of the flexible display, where m is an integer greater than 1. Each of the sensing circuits 250 has the first signal line O1, the first resistor Ra, the second resistor Rb, the third resistor Rc and a plurality of sensing units 260. The first resistor Ra is electrically coupled between the first signal line O1 and the first system voltage Vss, and the sensing units 260 are electrically coupled between the first signal line O1 and the second system voltage Vdd. The scan circuit 120 provides the scan signal to the sensing units 260 of the sensing circuits 250 via scan lines $S_1$ to $S_M$ sequentially, such that the processing circuit 130 may obtain at least a curvature of the flexible display according to the deformation signals $S_{c1}$ to $S_{cm}$ outputted from the first signal lines O1 of the sensing circuits 250. M and m are integers greater than 1.

Each of the sensing units 260 has a plurality of first transistors Q1 and a strain sensor 262. In each of the sensing units 260, the first ends D of the first transistors Q1 are coupled to the second system voltage Vdd, the second ends S of the first transistors Q1 are coupled to an end of the strain sensor 262, the control ends G of the first transistors Q1 are coupled to a corresponding scan line $S_Q$, and another end of the strain sensor 262 is coupled to the first signal line O1. Q is an positive integer, and 1≤Q≤M. The strain sensor 262 is configured to sense the stress applied to the flexible display at a position where the strain sensor 262 is located thereon, and the first transistor Q1 is configured to turn on/off the strain sensor 262. The strain sensor 262 may comprises sensing resistors or other components which have one or more physical properties that are varied along with the strain and/or stress applied thereon. For example, the strain sensor 262 may comprises a plurality of strain sensing units $R_1$ to $R_P$ connected in series, and the resistance of each of the strain sensing units $R_1$ to $R_P$ is varied with the strain and/or stress applied thereon. In an embodiment of the present invention, the strain sensing units $R_1$ to $R_P$ are sensing resistors.

In the embodiment of FIGS. 20 and 21, since the strain sensing units $R_1$ to $R_P$ are connected in series, an equivalent resistance of the strain sensing units $R_1$ to $R_P$ are greater than the resistance of a single one of the strain sensing units $R_1$ to $R_P$. Moreover, since the first transistors Q1 are connected in parallel, an equivalent resistance of the first transistors Q1 is less than the resistance of a single one of the first transistors Q1. Therefore, the effect of connecting the first transistors Q1 in parallel is similar the effect of increasing the width-to-length ratio (W/L) of a first transistor Q1. Accordingly, as compared to the sensing circuit 150, the sensing circuit 250 has a higher sensitivity of sensing the strain and/or stress.

Figure 22:
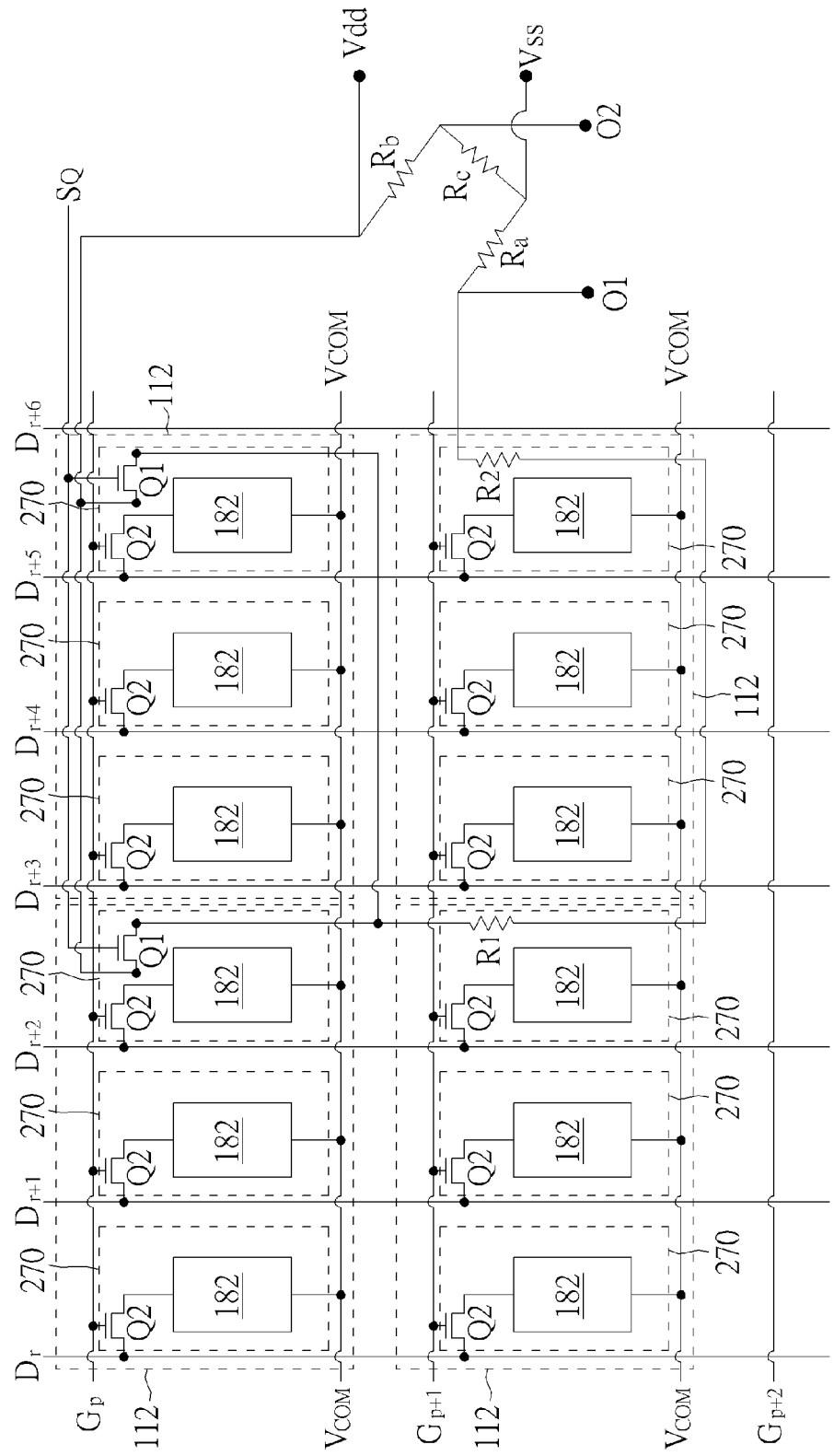
FIG. 22 is used to illustrate the layout of the flexible display in FIG. 20.

Please refer to FIG. 22. FIG. 22 is used to illustrate the layout of the flexible display in FIG. 20. In the embodiment, the flexible display is a colorful display, and each of the pixels 112 has three second transistor Q2 and three display units 182 used to display red, green and blue respectively. The flexible display further comprises a plurality of scan lines (e.g. the scan lines $G_p$ to $G_{p+2}$), a plurality of data lines (e.g. the data lines $D_r$ to $D_{r+6}$) and a common voltage $V_{COM}$. Each of the second transistors Q2 is coupled to a corresponding scan line and a corresponding data line, and an end of each of the display units 182 is coupled to the common voltage $V_{COM}$. Scan signals are transmitted to the second transistors Q2 via the scan lines to turn on the second transistors Q2. When one of the second transistors Q2 is turned on, data of the pixel is transmitted through the data line and the turn-on second transistor Q2 to a corresponding display unit 182 to refresh the display status (e.g. gray-level) of the corresponding display unit 182. The scan lines $G_p$ to $G_{p+2}$ and the data lines $D_r$ to $D_{r+6}$ demarcate a plurality of pixel areas 270, and each of the pixel areas 270 is bounded by two neighboring scan lines and two neighboring data lines. It is be noted that even though FIG. 22 merely illustrates three scan lines $G_p$ to $G_{p+2}$ and seven data lines $D_r$ to $D_{r+6}$, the numbers of the scan lines and the data lines of the flexible display may be equal to other numbers, and the numbers are depended on the resolution of the flexible display. In the embodiment, a sensing unit is integrated in four pixels 112 illustrated in FIG. 22, and the sensing unit has two first transistors Q1 and strain sensing units $R_1$ and $R_2$. The two first transistors Q1 and the strain sensing units $R_1$ and $R_2$ are positioned within different pixel areas 270. Moreover, if the sensing unit has three or more strain sensing units, the sensing units may be positioned within two or more different pixel areas 270. Because the two first transistors Q1 are connected in parallel, an equivalent resistance of the two first transistors Q1 is less than the resistance of a single first transistor Q1. Accordingly, the effect of connecting the two first transistors Q1 in parallel is similar the effect of increasing the width-to-length ratio (W/L) of a first transistor Q1. In addition, the layout area of the first transistor Q1 has a positive correlation with the width-to-length ratio of the first transistor Q1. Accordingly, the greater the width-to-length ratio of the first transistor Q1, the greater the layout area of the first transistor Q1 is. Therefore, even though the sensitivity of the sensing unit for sensing the strain and/or stress may be improved by increasing the width-to-length ratio of the first transistor Q1, it is still difficult to layout the circuits of the flexible display since the layout area of the first transistor Q1 is too large. However, according to the foresaid method for connecting the first transistors Q1 in parallel, the sensitivity of the sensing unit for sensing the strain and/or stress may be improved without increasing the layout area of a single first transistor Q1.

Figure 23:
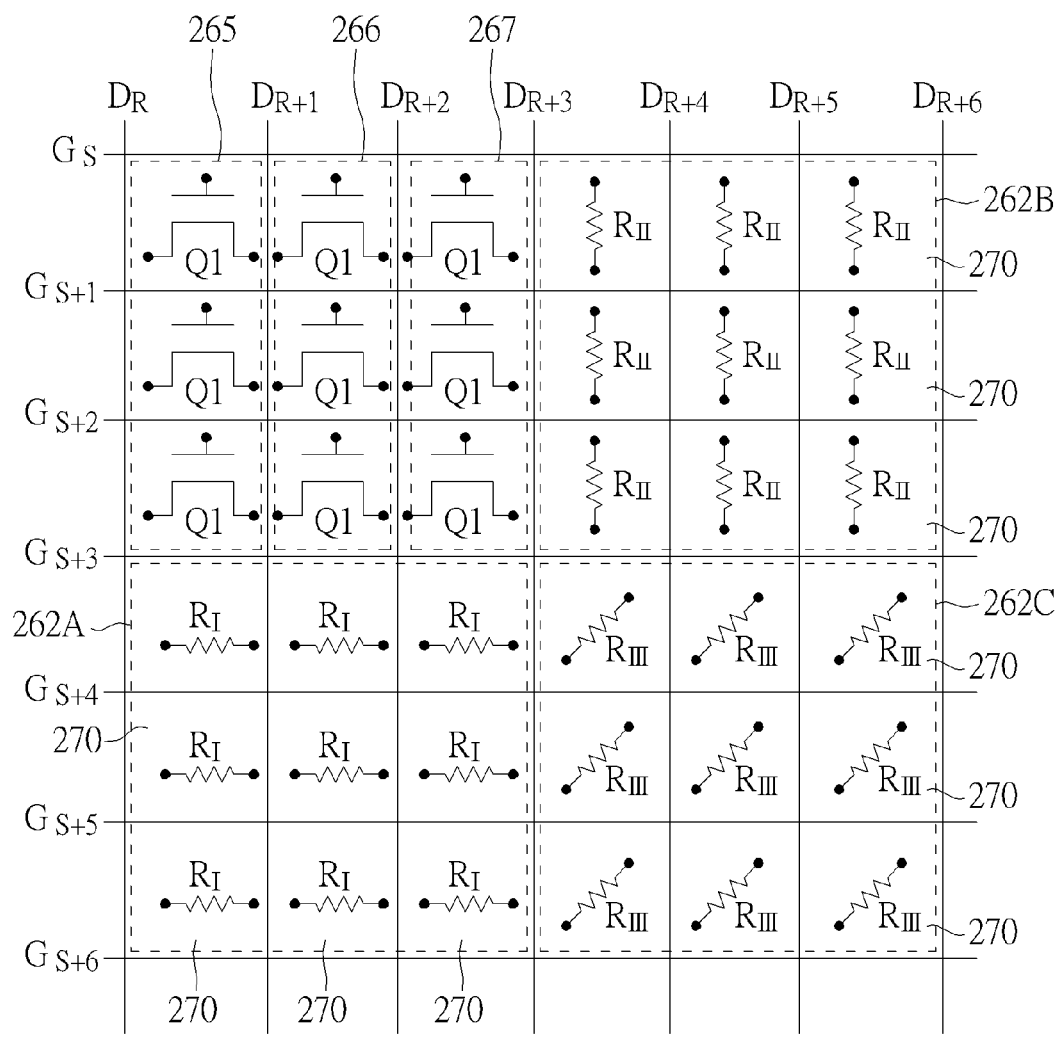
FIG. 23 is used to illustrate another layout of the flexible display in FIG. 20.
Figure 23:
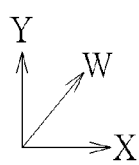
Figure 24:
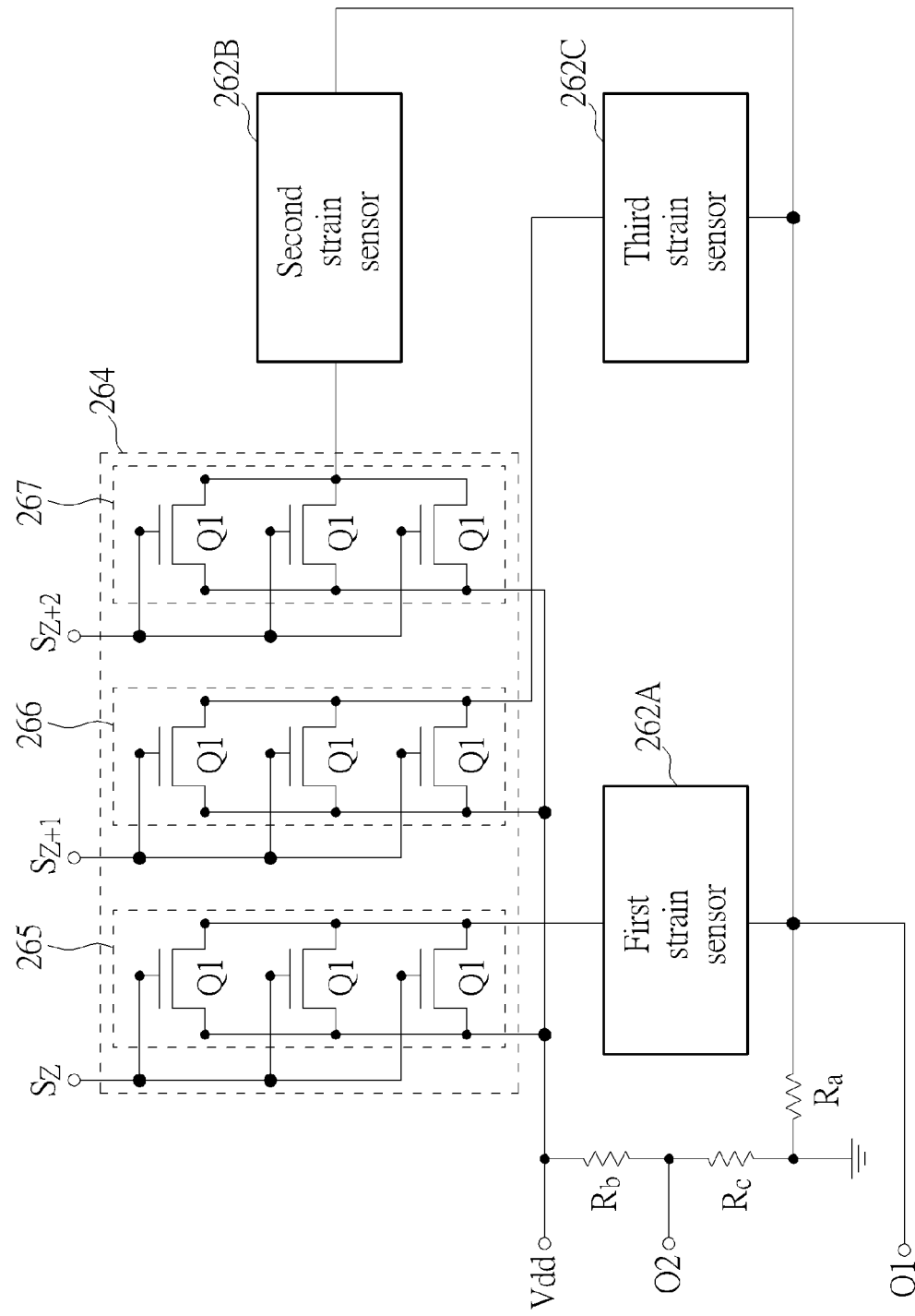
FIG. 24 is a circuit diagram of the flexible display in FIG. 20 according to the layout illustrated in FIG. 23.

Please refer to FIGS. 23 and 24. FIG. 23 is used to illustrate another layout of the flexible display in FIG. 20. FIG. 24 is a circuit diagram of the flexible display in FIG. 20 according to the layout illustrated in FIG. 23. In the embodiment, the flexible display comprises the display units 182, the pixel control circuits 114, a plurality of scan lines $G_S$ to $G_{S+6}$ and a plurality of data lines $D_R$ to $D_{R+6}$. Each of the pixel control circuits 114 is coupled to one of the scan lines $G_S$ to $G_{S+6}$ and one of the data lines $D_R$ to $D_{R+6}$ to control a corresponding one of the display units 182. It is be noted that the function of the scan lines $G_S$ to $G_{S+6}$ is different from that of the scan lines $S_1$ to $S_M$. The scan lines $G_S$ to $G_{S+6}$ are used to turn on/off the second transistors Q2 of the pixel control circuits 114, and the scan lines $S_1$ to $S_M$ are used to transmit scan signals to the sensing units 260 of the sensing circuits 250 to turn on/off the first transistors Q1. The scan lines $G_S$ to $G_{S+6}$ and the data lines $D_R$ to $D_{R+6}$ demarcate a plurality of pixel areas 270, and each of the pixel areas 270 is bounded by two neighboring scan lines and two neighboring data lines. It is be noted that even though FIG. 23 merely illustrates seven scan lines $G_S$ to $G_{S+6}$ and seven data lines $D_R$ to $D_{R+6}$, the numbers of the scan lines and the data lines of the flexible display may be equal to other numbers, and the numbers are depended on the resolution of the flexible display. Moreover, FIG. 23 and FIG. 24 illustrate three strain sensors 262 of three different sensing units 260, which are a first strain sensor 262A, a second strain sensor 262B and a third strain sensor 262C. The strain sensing units $R_1$ to $R_P$ of the first strain sensor 262A are presented as first strain sensing units $R_I$, the strain sensing units $R_1$ to $R_P$ of the second strain sensor 262B are presented as second strain sensing units $R_{II}$, and the strain sensing units $R_1$ to $R_P$ of the third strain sensor 262C are presented as third strain sensing units $R_{III}$. The first strain sensing units $R_I$, the second strain sensing units $R_{II}$ and the third strain sensing units $R_{III}$ are configured to sensing the strains and/or stresses of the flexible display along the first direction X, the second direction Y and the third direction W. Each of the three sensing units 260 has a plurality of first transistors Q1 to form a first group 265, a second group 266 or a third group 267 to control the first strain sensor 262A, the second strain sensor 262B or the third strain sensor 262C according to the scan signal received from the scan line $S_Z$, $S_{Z+1}$ or $S_{Z+2}$. Z is a positive integer. Moreover, each of the first strain sensing units $R_I$, the second strain sensing units $R_{II}$ and the third strain sensing units $R_{III}$ and the first transistors is positioned within one of pixel areas 270. In other words, the first transistors Q1 and the strain sensors of each sensing units 260 are positioned within the pixel areas 270 and are corresponded to the display units 182.

Please refer to FIG. 21 again. Since the first transistors Q1 are connected in parallel and positioned within different pixel areas 270, the sensitivity of the sensing unit for sensing the strain and/or stress may be improved without increasing the layout area of a single first transistor Q1. The material of the strain sensing units $R_1$ to $R_P$ may be metal (e.g. Molybdenum (Mo), Aluminium (Al), Titanium (Ti), etc.) or semiconductor (e.g. Indium Tin Oxide (ITO), poly silicon, etc.). Each of the strain sensing units $R_1$ to $R_P$ has a resistance directly proportional to its length, inversely proportional to its cross-sectional area, and varied with the strain and/or stress applied thereon. Moreover, since the resistance of the strain sensor 262 is equal to an equivalent resistance of the strain sensing units $R_1$ to $R_P$, and the sensitivity of the sensing unit 260 for sensing the strain and/or stress may be improved by increasing the resistance of the strain sensor 262, the sensitivity of the sensing unit 260 for sensing the strain and/or stress may be also improved by connecting the strain sensing units $R_1$ to $R_P$ in series. In addition, because the strain sensing units $R_1$ to $R_P$ are positioned within different pixel areas 270, the layout area of each pixel area 270 may be used more effectively, and it is unnecessary to divide another area from the display panel of the flexible display to place all of strain sensing units $R_1$ to $R_P$.

In summary, the flexible display according to an embodiment of the present invention may calculate the resistance of each of the sensing resistors of the flexible display according to the variations of the voltage levels of the first signal lines, and may accurately calculate at least a curvature of the flexible display according to the resistance of each of the sensing resistors. The resistance of each of the sensing resistors is varied with a strain and/or stress applied thereon. When the accurate curvature of the flexible display is obtained, related operations, e.g. image calibration, feedback of user motion, etc., of the flexible display may be performed according to the curvature of the flexible display. Therefore, when a user curves the flexible display, the interactions between the user and the flexible display may be determined accurately, such that the flexible display may respond to the interactions properly. Moreover, since the pixel control circuits and the sensing circuit may be formed in the TFT layer of the flexible display, the manufacture procedure of the flexible display may be simplified. Additionally, sensitivity of the sensing unit may be improved by connecting a plurality of strain sensing units in series and/or connecting a plurality of first transistors in parallel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible display, comprising:
    a display layer, having a plurality of display units;
    a thin-film transistor layer, having a plurality of pixel control circuits and a plurality of sensing circuits, the pixel control circuits being configured to control the display units, and each of the plurality of sensing circuits being configured to provide a deformation signal according to deformation of the flexible display, each of the plurality of sensing circuits comprising:
        a first signal line, configured to transmit the deformation signal provided by each of the plurality of sensing circuits;
        a first resistor, electrically coupled between the first signal line and a first system voltage; and
        a plurality of sensing units, electrically coupled between the first signal line and a second system voltage, each of the plurality of sensing units comprising:
            at least a first transistor, having a control end, a first end and a second end, the control end being configured to receive a scan signal, and the first end being electrically coupled to the second system voltage; and
            a strain sensor, electrically coupled between the second end of the at least a first transistor and the first resistor, and comprising a plurality of strain sensing units coupled in series, resistance of each of the plurality of strain sensing units being varied with a strain and/or stress applied to each of the plurality of strain sensing units; and
    a flexible substrate, stacked with the thin-film transistor layer.

2. The flexible display of claim 1 further comprising a plurality of scan lines and a plurality of data lines, wherein each of the plurality of display units is positioned within one of pixel areas, and each of the pixel areas is bounded by two neighboring scan lines and two neighboring data lines, each of the plurality of pixel control circuits is coupled to one of the scan lines and one of the data lines, and at least two of the sensing units are positioned within two different pixel areas of the pixel areas.

3. The flexible display of claim 1, wherein each of the plurality of sensing units is a sensing resistor.

4. The flexible display of claim 1 further comprising a processing circuit electrically coupled to the first signal line of each of the plurality of sensing units, wherein the processing circuit is configured to obtain at least a curvature of the flexible display according to the deformation signal transmitted from the first signal line of each of the plurality of sensing units.

5. The flexible display of claim 4, wherein each of the plurality of sensing circuits further comprises:
    a second signal line;
    a second resistor, electrically coupled between the second system voltage and the second signal line; and
    a third resistor, electrically coupled between the first system voltage and the second signal line;
    wherein the processing circuit is electrically coupled to the second signal line of each of the plurality of sensing circuits, and is configured to obtain the at least a curvature of the flexible display according to a voltage difference between the first signal line and the second signal line of each of the plurality of sensing circuits.

6. The flexible display of claim 4, wherein an image displayed on the flexible display is adjusted according to the at least a curvature of the flexible display.

7. The flexible display of claim 1, wherein the at least a first transistor of each of the plurality of sensing units comprises a plurality of first transistors connected in parallel, and a control end of each of the plurality of first transistors receives the scan signal, a first end of each of the plurality of first transistors is electrically connected to the second system voltage, and a second end of each of the plurality of first transistors is electrically connected to the strain sensor.

8. The flexible display of claim 1, wherein the sensing units comprise:
    a plurality of first sensing units, configured to sense strains and/or stresses applied to the flexible display along a first direction; and
    a plurality of second sensing units, configured to sense strains and/or stresses applied to the flexible display along a second direction, wherein the second direction is substantially perpendicular to the first direction.

9. A flexible display, comprising:
    a display layer, having a plurality of display units;
    a thin-film transistor layer, having a plurality of pixel control circuits and a plurality of sensing circuits, the pixel control circuits being configured to control the display units, and each of the plurality of sensing circuits being configured to provide a deformation signal according to deformation of the flexible display; and a flexible substrate, stacked with the thin-film transistor layer;
wherein each of the plurality of sensing circuits comprises:
a first signal line, configured to transmit the deformation signal provided by the each of the plurality of sensing circuits;
a first resistor, electrically coupled between the first signal line and a first system voltage; and
a plurality of sensing units, electrically coupled between the first signal line and a second system voltage, each of the plurality of sensing units comprising:
at least a first transistor, having a control end, a first end and a second end, the control end being configured to receive a scan signal, and the first end being electrically coupled to the second system voltage; and
a strain sensor, electrically coupled between the second end of the at least a first transistor and the first resistor, resistance of the strain sensor being varied with a strain and/or stress applied to the strain sensor.

10. The flexible display of claim 9, wherein the sensing units comprise:
a plurality of first sensing units, configured to sense strain and/or stresses applied to the flexible display along a first direction, the strain sensor of each of the plurality of first sensing units having a plurality of first sections connected in series, the first sections being substantially in parallel with the first direction, and a straight line through centers of two of the first sections being substantially perpendicular to the first direction; and
a plurality of second sensing units, configured to sense strains and/or stresses applied to the flexible display along a second direction, the strain sensor of each of the plurality of second sensing units having a plurality of second sections connected in series, the second sections being substantially in parallel with the second direction, and a straight line through centers of two of the second sections being substantially perpendicular to the second direction.

11. The flexible display of claim 9, wherein each of the plurality of pixel control circuits comprises a second transistor, and a source and a drain of the second transistor and the strain sensors of the sensing units are formed in a same structure layer of the flexible display.

12. The flexible display of claim 9, wherein each of the plurality of pixel control circuits comprises a second transistor, and a control end of the second transistor and the strain sensors of the sensing units are formed in a same structure layer of the flexible display.

13. The flexible display of claim 9, wherein each of the plurality of pixel control circuits comprises a second transistor configured to control operations of refreshing the display units, and a control end of the second transistor and the control end of each of the at least first transistor are formed in a same structure layer of the flexible display.

14. The flexible display of claim 9 further comprising a processing circuit electrically coupled to the first signal line of each of the plurality of sensing units, wherein the processing circuit is configured to obtain at least a curvature of the flexible display according to the deformation signal transmitted from the first signal line of each of the plurality of sensing units.

15. The flexible display of claim 14, wherein each of the plurality of sensing circuits further comprises:
a second signal line;
a second resistor, electrically coupled between the second system voltage and the second signal line; and
a third resistor, electrically coupled between the first system voltage and the second signal line;
wherein the processing circuit is electrically coupled to the second signal line of each of the plurality of sensing circuits, and is configured to obtain the at least a curvature of the flexible display according to a voltage difference between the first signal line and the second signal line of each of the plurality of sensing circuits.

16. The flexible display of claim 14, wherein an image displayed on the flexible display is adjusted according to the at least a curvature of the flexible display.

17. The flexible display of claim 9, wherein the at least a first transistor of each of the plurality of sensing units comprises a plurality of first transistors connected in parallel, and a control end of each of the plurality of first transistors receives the scan signal, a first end of each of the plurality of first transistors is electrically connected to the second system voltage, and a second end of each of the plurality of first transistors is electrically connected to the strain sensor.

18. The flexible display of claim 9, wherein the sensing units comprise:
a plurality of first sensing units, configured to sense strain and/or stresses applied to the flexible display along a first direction; and
a plurality of second sensing units, configured to sense strain and/or stresses applied to the flexible display along a second direction, wherein the second direction is substantially perpendicular to the first direction.

* * * * *